(12) United States Patent
Hautala et al.

(10) Patent No.: US 8,226,835 B2
(45) Date of Patent: *Jul. 24, 2012

(54) ULTRA-THIN FILM FORMATION USING GAS CLUSTER ION BEAM PROCESSING

(75) Inventors: John J. Hautala, Beverly, MA (US);
Edmund Burke, West Newbury, MA (US); Noel Russell, Waterford, NY (US);
Gregory Herdt, Selkirk, NY (US)

(73) Assignee: TEL Epion Inc., Billerica, MA (US)

( * ) Notice: Subject to any disclaimer, the term of this patent is extended or adjusted under 35 U.S.C. 154(b) by 480 days.

This patent is subject to a terminal disclaimer.

(21) Appl. No.: 12/399,449

(22) Filed: Mar. 6, 2009

(65) Prior Publication Data

US 2010/0227142 A1 Sep. 9, 2010

(51) Int. Cl.
*H01L 21/44* (2006.01)

(52) U.S. Cl. ......... 216/18; 216/62; 216/67; 216/87; 216/88; 427/523; 427/527; 427/533; 427/535; 438/631; 438/634; 438/689; 438/692; 438/902

(58) Field of Classification Search .................. None
See application file for complete search history.

(56) References Cited

U.S. PATENT DOCUMENTS

| | | | |
|---|---|---|---|
| 4,361,762 A | 11/1982 | Douglas | |
| 4,886,971 A | 12/1989 | Matsumura et al. | |
| 4,916,311 A | 4/1990 | Fuzishita et al. | |
| 6,756,672 B1 * | 6/2004 | You et al. | 257/751 |
| 6,797,339 B2 * | 9/2004 | Akizuki et al. | 427/562 |
| 7,060,989 B2 * | 6/2006 | Swenson et al. | 250/423 R |
| 7,071,126 B2 * | 7/2006 | Johnston et al. | 438/783 |
| 7,173,252 B2 | 2/2007 | Mack | |
| 7,553,763 B2 * | 6/2009 | Hsiao et al. | 438/659 |
| 7,670,964 B2 * | 3/2010 | Lane | 438/788 |

(Continued)

FOREIGN PATENT DOCUMENTS

JP 62296357 A 12/1987

OTHER PUBLICATIONS

Akizuki, M. et al "SiO2 film formation at room temperature by gas cluster ion beam oxidation" Nuclear Instruments and Methods in Physics Research B 112 (1996) 83-85, no month available.*

(Continued)

*Primary Examiner* — Anita Alanko
(74) *Attorney, Agent, or Firm* — Wood, Herron & Evans, LLP

(57) ABSTRACT

A method of preparing a thin film on a substrate is described. The method comprises forming an ultra-thin hermetic film over a portion of a substrate using a gas cluster ion beam (GCIB), wherein the ultra-thin hermetic film has a thickness less than approximately 5 nm. The method further comprises providing a substrate in a reduced-pressure environment, and generating a GCIB in the reduced-pressure environment from a pressurized gas mixture. A beam acceleration potential and a beam dose are selected to achieve a thickness of the thin film less than about 5 nanometers (nm). The GCIB is accelerated according to the beam acceleration potential, and the accelerated GCIB is irradiated onto at least a portion of the substrate according to the beam dose. By doing so, the thin film is formed on the at least a portion of the substrate to achieve the thickness desired.

23 Claims, 20 Drawing Sheets

U.S. PATENT DOCUMENTS

| | | | |
|---|---|---|---|
| 7,749,849 B2* | 7/2010 | Hu et al. | 438/292 |
| 7,794,798 B2* | 9/2010 | Hautala | 427/526 |
| 7,816,253 B2* | 10/2010 | Chen et al. | 438/622 |
| 7,838,423 B2* | 11/2010 | Learn et al. | 438/687 |
| 7,871,929 B2* | 1/2011 | Russell et al. | 438/687 |
| 7,905,199 B2* | 3/2011 | Hautala et al. | 118/723 CB |
| 2002/0068128 A1* | 6/2002 | Akizuki et al. | 427/248.1 |
| 2002/0130275 A1 | 9/2002 | Mack et al. | |
| 2005/0042800 A1* | 2/2005 | Yamada et al. | 438/105 |
| 2005/0272237 A1 | 12/2005 | Hautala et al. | |
| 2006/0093753 A1* | 5/2006 | Nickel | 427/523 |
| 2006/0105570 A1 | 5/2006 | Hautala et al. | |
| 2007/0184655 A1* | 8/2007 | Learn et al. | 438/687 |
| 2008/0122076 A1* | 5/2008 | Hong et al. | 257/734 |
| 2009/0087969 A1* | 4/2009 | Russell et al. | 438/514 |
| 2009/0104754 A1* | 4/2009 | Russell et al. | 438/474 |
| 2009/0152629 A1* | 6/2009 | Hu et al. | 257/344 |
| 2009/0314963 A1* | 12/2009 | Hautala | 250/492.21 |
| 2009/0317564 A1* | 12/2009 | Hautala et al. | 427/563 |
| 2010/0164111 A1* | 7/2010 | Yang et al. | 257/758 |
| 2011/0084214 A1* | 4/2011 | Hautala et al. | 250/396 R |
| 2012/0064713 A1* | 3/2012 | Russell et al. | 438/653 |

OTHER PUBLICATIONS

Akizuki, M., et al "Irradiation effects of O2 cluster ions for lead oxide film formation" Nuclear Instruments and Methods in Physics Research B 121 (1997) 166-169, no month available.*

Isao Yamada et al., "Materials Processing by Gas Cluster Ion Beams", Materials Science and Engineering Reports, vol. 34, Issue 6, pp. 231-295, Oct. 30, 2001 (ISSN 09S7-796X).

Saitoh, Y. et al., Acceleration of cluster and molecular ions by TIARA 3 MV tandem accelerator, vol. 452, No. 1-2, Sep. 21, 2000, pp. 61-66, XP004210610, ISSN: 0168-9002.

Yamada, I. et al., Surface modification with gas cluster ion beams, Nuclear Instruments & Methods in Physics Research, vol. B79, Nov. 2, 1992, pp. 223-226, XP001031961, ISSN: 0168-583X.

Gras et al., Integration and characterization of gas cluster processing for copper interconnects electromigration improvement, Microelectronic Engineering, Sep. 25, 2007, 6 pp., vol. 84, No. 11, Elsevier Publishers BV, Amsterdam, NL.

Hautala et al., Gas cluster ion beam application to porous low-k dielectrics, Advanced Metallization Conference Mat. Res. Soc., 11 pp., Warrendale, PA, U.S., 2004.

Majumder et al., Atomic layer deposited ultrathin HfO2 and Al2O3 films as diffusion barriers in copper interconnects, Electrochemical and Solid-State Letters, Electrochem. Soc., Oct. 2007, 5 pp., vol. 10, No. 10, U.S.

European Patent Office, Search Report and Written Opinion issued in related International Application No. PCT/US2010/023014, Jun. 16, 2010, 14 pp.

* cited by examiner

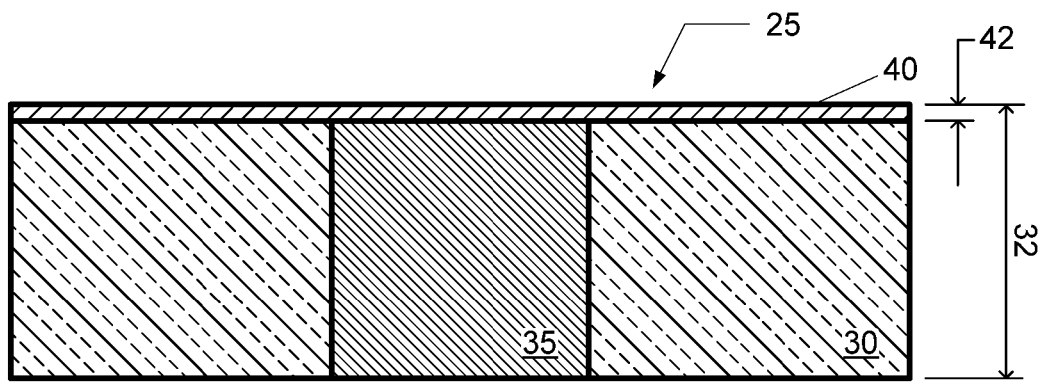
FIG. 2
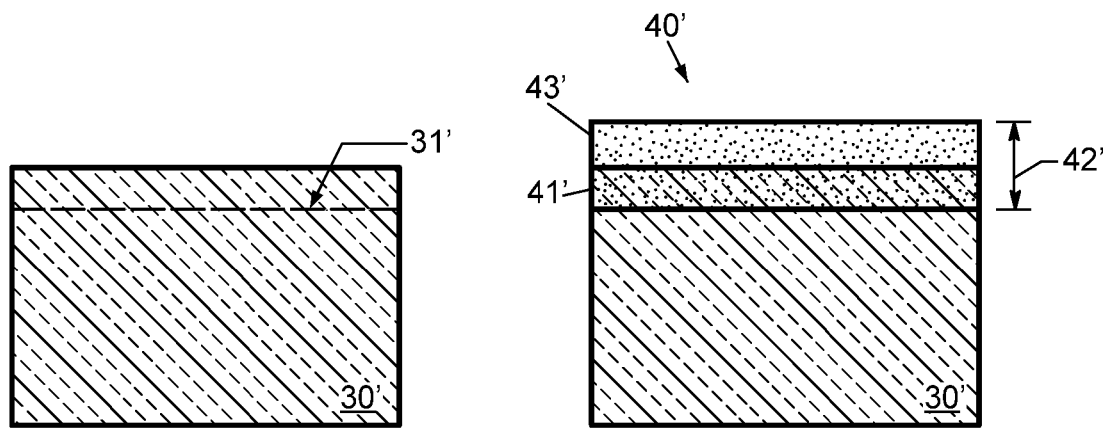
FIG. 3A
FIG. 3B
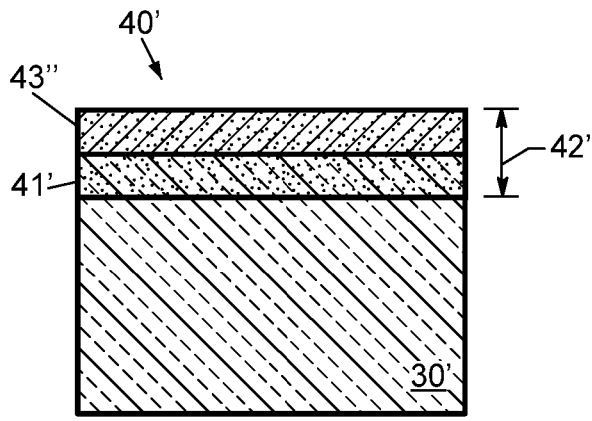
FIG. 3C

ULTRA-THIN FILM FORMATION USING GAS CLUSTER ION BEAM PROCESSING

BACKGROUND OF THE INVENTION

1. Field of Invention

The invention relates to a method for forming an ultra-thin film using a gas cluster ion beam (GCIB).

2. Description of Related Art

Gas cluster ion beams (GCIB's) are used for etching, cleaning, smoothing, and forming thin films. For purposes of this discussion, gas clusters are nano-sized aggregates of materials that are gaseous under conditions of standard temperature and pressure. Such gas clusters may consist of aggregates including a few to several thousand molecules, or more, that are loosely bound together. The gas clusters can be ionized by electron bombardment, which permits the gas clusters to be formed into directed beams of controllable energy. Such cluster ions each typically carry positive charges given by the product of the magnitude of the electron charge and an integer greater than or equal to one that represents the charge state of the cluster ion.

The larger sized cluster ions are often the most useful because of their ability to carry substantial energy per cluster ion, while yet having only modest energy per individual molecule. The ion clusters disintegrate on impact with the substrate. Each individual molecule in a particular disintegrated ion cluster carries only a small fraction of the total cluster energy. Consequently, the impact effects of large ion clusters are substantial, but are limited to a very shallow surface region. This makes gas cluster ions effective for a variety of surface modification processes, but without the tendency to produce deeper sub-surface damage that is characteristic of conventional ion beam processing.

Conventional cluster ion sources produce cluster ions having a wide size distribution scaling with the number of molecules in each cluster that may reach several thousand molecules. Clusters of atoms can be formed by the condensation of individual gas atoms (or molecules) during the adiabatic expansion of high pressure gas from a nozzle into a vacuum. A skimmer with a small aperture strips divergent streams from the core of this expanding gas flow to produce a collimated beam of clusters. Neutral clusters of various sizes are produced and held together by weak inter-atomic forces known as Van der Waals forces. This method has been used to produce beams of clusters from a variety of gases, such as helium, neon, argon, krypton, xenon, nitrogen, oxygen, carbon dioxide, sulfur hexafluoride, nitric oxide, and nitrous oxide, and mixtures of these gases.

Several emerging applications for GCIB processing of substrates on an industrial scale are in the semiconductor field. Although GCIB processing of a substrate is performed in a wide variety of processes, many processes fail to provide adequate control of critical properties and/or dimensions of the surface, structure, and/or film subject to GCIB treatment.

SUMMARY OF THE INVENTION

The invention relates to a method for forming a thin film using a gas cluster ion beam (GCIB).

The invention further relates to a method for depositing or growing a thin film on a substrate using a GCIB.

According to one embodiment, a method of preparing a thin film is described. The method comprises forming an ultra-thin hermetic film over a portion of a substrate using a GCIB, wherein the ultra-thin hermetic film has a thickness less than approximately 5 nm.

According to another embodiment, a method of forming an ultra-thin hermetic film on a substrate is described. The method comprises: providing a substrate in a reduced-pressure environment; generating a GCIB in the reduced-pressure environment from a pressurized gas mixture; selecting a beam acceleration potential and a beam dose to achieve a thickness of a thin film less than about 5 nm; accelerating the GCIB according to the beam acceleration potential; irradiating the accelerated GCIB onto at least a portion of the substrate according to the beam dose; and forming the ultra-thin hermetic film on the at least a portion of the substrate to achieve the thickness.

According to another embodiment, a method of preparing an interconnect structure is described. The method comprises: forming the ultra-thin hermetic film over a metal line using the GCIB; forming an inter-level dielectric layer above the ultra-thin hermetic film; and etching a pattern into the inter-level dielectric layer and stopping on the ultra-thin hermetic film.

According to another embodiment, a method of preparing an interconnect structure is described. The method comprises: forming an inter-level dielectric layer; depositing the ultra-thin hermetic film over the inter-level dielectric layer using the GCIB; etching a trench, or via, or both into the inter-level dielectric layer; metalizing the trench, or via, or both; and polishing the metalized trench, or via, or both until the ultra-thin film is reached.

According to another embodiment, a method of preparing an interconnect structure is described. The method comprises: forming an inter-level dielectric layer; forming a chemical-mechanical polishing (CMP) stop layer over the inter-level dielectric layer; etching a trench, or via, or both into the inter-level dielectric layer; metalizing the trench, or via, or both; polishing the metalized trench, or via, or both until the CMP stop layer is reached without over-polishing the metalized trench, or via, or both; and forming the ultra-thin hermetic film over the polished, metalized trench, or via, or both using the GCIB.

According to another embodiment, a method of preparing an interconnect structure is described. The method comprises: forming a first ultra-thin hermetic film over a metal line using a first GCIB; forming a first inter-level dielectric layer above the first ultra-thin hermetic film; forming a second ultra-thin hermetic film over the first inter-level dielectric layer using a second GCIB; forming a second inter-level dielectric layer over the second ultra-thin hermetic film; etching a via into the first inter-level dielectric layer and stopping on the first ultra-thin hermetic film; and etching a trench into the second inter-level dielectric layer and stopping on the second ultra-thin hermetic film, where both the first and second ultra-thin hermetic films have a thickness less than about 5 nm.

According to another embodiment, a copper interconnect is described including a thin film capping layer formed using a GCIB, the thin film capping layer having a thickness less than approximately 5 nm.

According to another embodiment, an inter-level dielectric layer is described including a thin film capping layer formed using a GCIB, the thin film capping layer having a thickness less than approximately 5 nm.

According to yet another embodiment, an ultra-thin barrier layer is described including a thin film layer formed using a GCIB, the thin film layer having a thickness less than approximately 5 nm.

BRIEF DESCRIPTION OF THE DRAWINGS

In the accompanying drawings:

FIG. 2 illustrates, in schematic cross-sectional view, a method of preparing an interconnect structure according to an embodiment;

FIGS. 3A through 3C illustrate, in schematic cross-sectional view, a method of forming an ultra-thin film according to several embodiments;

DETAILED DESCRIPTION OF SEVERAL EMBODIMENTS

Figure 1A:
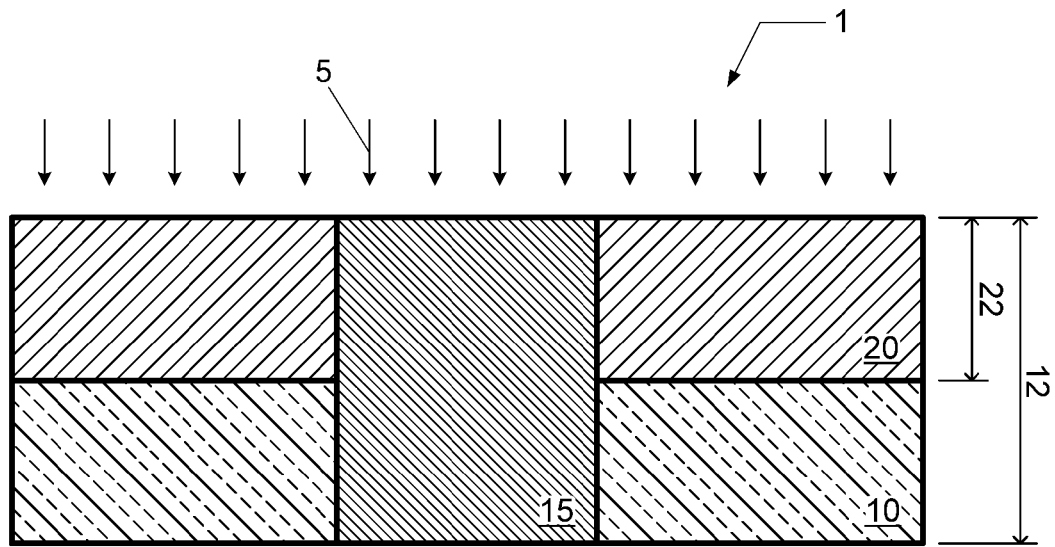
FIGS. 1A and 1B illustrate, in schematic cross-sectional view, a method of preparing an interconnect structure according to the prior art.

A method and system for forming a thin film on a substrate using a gas cluster ion beam (GCIB) is disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

In the description and claims, the terms "coupled" and "connected," along with their derivatives, are used. It should be understood that these terms are not intended as synonyms for each other. Rather, in particular embodiments, "connected" may be used to indicate that two or more elements are in direct physical or electrical contact with each other while "coupled" may further mean that two or more elements are not in direct contact with each other, but yet still co-operate or interact with each other.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

As described above, there is a general need for forming thin films of material on a surface of a substrate using a GCIB. In particular, there is a need to form thin films on a substrate, while providing adequate control of critical properties and/or dimensions of the surface, structure, and/or film subject to GCIB treatment. Furthermore, as described above, there is a need for depositing or growing ultra-thin hermetic films on only chosen surfaces of a substrate using a GCIB.

Herein, the term "to form" (or "forming", or "formation") is used to broadly represent the preparation of a thin film of material on one or more surfaces of a substrate. Additionally herein, "growth" and "deposition" are defined and used in a manner to distinguish from one another. During growth, a thin film is formed on a substrate, wherein only a fraction of the atomic constituents of the thin film are introduced in the GCIB and the remaining fraction is provided by the substrate upon which the thin film is grown. For example, when growing SiOx on a substrate, the substrate may comprise a silicon surface, which is irradiated by a GCIB containing oxygen. The grown layer is thus a reaction product of the silicon from the silicon surface and the oxygen from the GCIB. To the contrary, during deposition, a thin film is formed on a substrate, wherein substantially all of the atomic constituents of the thin film are introduced in the GCIB. For example, when depositing SiCx, the substrate is irradiated by a GCIB containing both silicon and carbon.

Figure 1B:
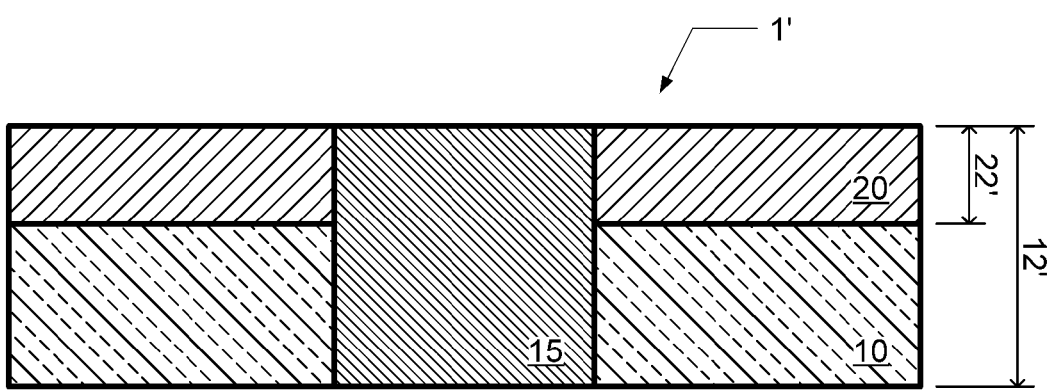

Referring now to FIGS. 1A and 1B, an interconnect structure of the prior art, in schematic cross-sectional view, is illustrated. A portion of an interconnect layer 1 is illustrated that includes a metal wiring layer with corresponding insulation layers. The interconnect layer 1 comprises a low dielectric constant (low-k) dielectric layer 10, dielectric capping layer 20, and metal line 15. Conventionally, the low-k dielectric layer 10 and dielectric capping layer 20 are formed using vapor deposition techniques and, thereafter, patterned and metalized to form the metal line 15. The low-k dielectric layer 10 may comprise a non-porous or porous, SiCOH-containing film, while the dielectric capping layer 20 may comprise $SiO_2$. The dielectric capping layer 20 may provide structural integrity to the insulation layers during ensuing process steps.

Following metallization, the metal filling the pattern in the low-k dielectric layer 10 and the dielectric capping layer 20 is polished back until the dielectric capping layer 20 is reached. Moreover, the metal line 15 and the dielectric capping layer 20 are over-polished (labeled as "5" in FIG. 1A) to reduce the thickness of the dielectric capping layer 20. As shown in FIGS. 1A and 1B, an initial overall thickness 12 of the interconnect layer 1 (and metal line 15) is reduced to a final overall thickness 12' of polished interconnect layer 1' (and metal line 15) following the over-polishing step 5. Moreover, an initial thickness 22 of the dielectric capping layer 20 is reduced to a final thickness 22' for the dielectric capping layer 20. Typically, the initial (22) and final (22') thicknesses of the dielectric capping layer 20 occupy a substantial fraction of the initial (12) and final (12') overall thicknesses of the metal line 15.

This limitation is due, in part, to the inability of conventional vapor deposition techniques to deposit thin films having a thickness less than about 10 nanometers (nm). As a result, the effective dielectric constant of the insulation layers (i.e., the low-k dielectric layer 10 and the dielectric capping layer 20) is compromised. For example, the initial overall thickness 12 of metal line 15 may be about 80 nm, and the final overall thickness 12' may be about 50 nm. Further, for example, the initial thickness 22 of the dielectric capping layer 20 may be about 50 nm, and the final thickness 22' may be about 20 nm. Consequently, the dielectric capping layer 20 (usually $SiO_2$ having a dielectric constant of 4) contributes to about 40% of the effective dielectric constant for the insulation layers. Conventional techniques, including chemical vapor deposition (CVD) and chemical-mechanical polishing (CMP), cannot achieve film thicknesses less than about 10 nm.

Referring now to FIG. 2, an interconnect structure, in schematic cross-sectional view, is illustrated according to an embodiment. A portion of an interconnect layer 25 is illustrated that includes a metal wiring layer with corresponding insulation layers. The interconnect layer 25 comprises a low-k dielectric layer 30, a capping layer 40, and a metal line 35. The low-k dielectric layer 30 is formed using vapor deposition techniques and, thereafter, patterned and metalized to form the metal line 35. The low-k dielectric layer 30 may comprise a non-porous or porous, SiCOH-containing film.

Unlike conventional interconnect layers, as described in FIGS. 1A and 1B, the capping layer 40 is formed using a GCIB. Therein, the capping layer 40 is formed having a thickness 42 less than about 5 nm, which is a small fraction of the total thickness 32 of the interconnect layer 25. As a result, while the capping layer 40 may serve as a barrier layer for subsequent interconnect layers, the dielectric constant of the insulation layers is minimally affected. Herein, a GCIB process is described for preparing an ultra-thin, hermetic film that may be integrated with an interconnect structure.

The inventors have discovered that ultra-thin films having a thickness of 5 nm (nanometers) and less that are formed using GCIB processing possess a level of hermeticity equivalent to substantially thicker films (by an order of magnitude) formed by conventional PECVD methodology. For example, the inventors have observed that ultra-thin films of SiN (less than 3 nm thick), as well as other materials, reduce copper mobility and electromigration at an interface between metal wiring and an adjacent insulating structure.

As illustrated in FIGS. 3A and 3B, during GCIB deposition, material is infused within a sub-layer 31' of the irradiated surface of substrate 30' at low GCIB dose, and eventually transitions to a purely deposition process at a higher GCIB dose. The infusion of material within the sub-layer 31' forms a mixed layer 41', which acts as a graded interface between the underlying substrate composition and a layer 43' subsequently deposited on substrate 30'. In part, the infused mixed layer 41' behaves as a diffusion barrier. However, the quality of the layer 43' deposited on the substrate 30' enhances the diffusion properties of an overall ultra-thin film 40' of thickness 42'. The material composition of the material infused in sub-layer 31' of substrate 30' to form the mixed layer 41' may be the same as the material composition of the material deposited to form layer 43', as shown in FIG. 3B (e.g., same stippling for mixed layer 41' and layer 43'). Alternatively, the material composition of the material infused in substrate 30' to form the mixed layer 41' may be different than the material composition of the material deposited to form layer 43", as shown in FIG. 3C (e.g., different cross-hatching and stippling for mixed layer 41' and layer 43"). In the former, one or more GCIBs may be used to form the overall ultra-thin film 40'. In the latter, two or more GCIBs may be used to form the overall ultra-thin film 40', including both the mixed layer 41' and the layer 43". Alternatively, in the latter, a conventional process may be used to form the mixed layer 41', followed by one or more GCIBs to form the layer 43". The conventional process may include an implant process, a growth process, an oxidation process, a nitridation process, etc.

The inventors have discovered that high-quality, sub-5 nm ultra-thin films may be formed using a growth and/or deposition process under various GCIB conditions. As will be described below, when growing an ultra-thin film, the inventors have observed that increasing the beam acceleration potential (or GCIB energy) can lead to thicker films for a given beam dose (or GCIB dose), while increasing the film roughness. Alternatively, the inventors have observed that a GCIB growth process using relatively lower GCIB energy and/or broader GCIB energy distribution may be performed to achieve sub-5 nm ultra-thin films, while achieving lower roughness. However, a broad range of GCIB energy and GCIB dose, including other parameters as will be discussed below, may be utilized to achieve sub-5 nm ultra-thin films. Additionally as will be described below, when depositing an ultra-thin film, the inventors have observed that increasing the GCIB energy can lead to thicker films for a given GCIB dose, while increasing the film roughness. Alternatively, the inventors have observed that a GCIB deposition process using relatively lower GCIB energy and/or broader GCIB energy distribution may be performed to achieve sub-5 nm ultra-thin films, while achieving lower roughness. However, a broad range of GCIB energy and GCIB dose, including other parameters as will be discussed below, may be utilized to achieve sub-5 nm ultra-thin films. Furthermore as will be discussed below, a pre-treatment process and/or post-treatment process may be performed to adjust one or more film properties including, but not limited to, a film thickness, a film roughness, a film adhesion, a film composition, etc.

Figure 4:
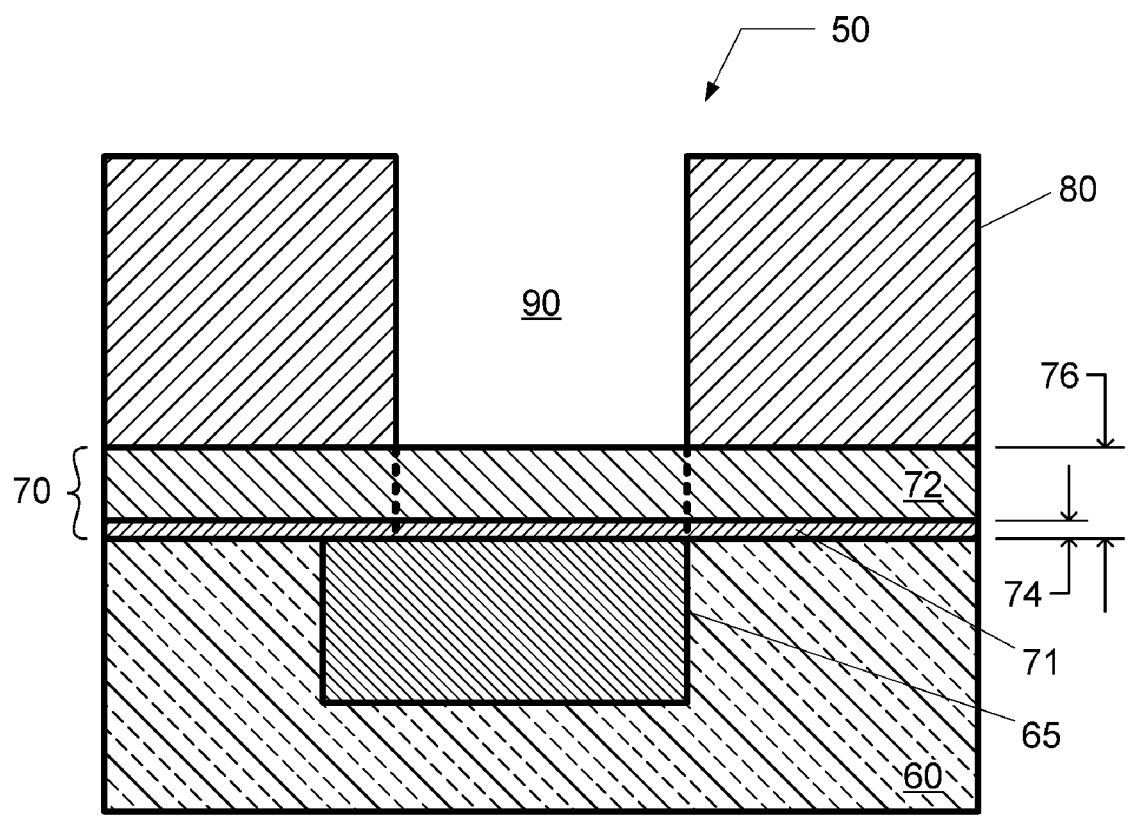
FIG. 4 illustrates, in schematic cross-sectional view, a method of preparing an interconnect structure according to another embodiment.

Referring now to FIG. 4, an interconnect structure, in schematic cross-sectional view, is illustrated according to another embodiment. A portion of an interconnect structure 50 is illustrated that includes a metal wiring layer with corresponding insulation layers and a contact via for making electrical contact to the metal wiring layer. The interconnect structure 50 comprises a first low-k dielectric layer 60 with a metal line 65. Overlying the first low-k dielectric layer 60, a second low-k dielectric layer 80 is prepared within which a contact via 90 is formed. Residing between the first low-k dielectric layer 60 and the second low-k dielectric layer 80, an etch stop layer 70 is inserted to facilitate a timely end to the etching step for forming contact via 90 while preventing penetration of the etch process to the underlying metal line 65.

The etch stop layer 70 can comprise a first layer 71 and a second layer 72, as illustrated in FIG. 4. The first layer 71 can be an ultra-thin, hermetic film formed using a GCIB process, wherein the first layer 71 serves, among other things, as a barrier layer and an adhesion layer (e.g., film with good adhesion to Cu). The first layer 71 is formed using a GCIB process to have a thickness 74 less than about 5 nm, which is a small fraction of the total thickness 76 of the etch stop layer 70. Conventional techniques, including CVD and CMP, cannot achieve film thicknesses less than about 10 nm.

The second layer 72 may complement the first layer 71 to provide a thicker etch stop layer 70; however, the material properties of the second layer 72 may be chosen to have a minimal effect on the effective dielectric constant of the first low-k dielectric layer 60 and the second low-k dielectric layer 80. Since the first layer 71 provides good barrier properties and good adhesion properties, the second layer 72 may be designed for good mechanical properties, while having a low dielectric constant. For example, the first layer may comprise a SiCN-containing film, while the second layer 72 may comprise a SiCO-containing film.

Therefore, according to an embodiment, a method of preparing a thin film is described. The method comprises forming an ultra-thin hermetic film over a portion of a substrate using a GCIB, wherein the ultra-thin hermetic film has a thickness less than approximately 5 nm.

According to another embodiment, a method of forming an ultra-thin layer on a substrate is described. The method comprises: providing a substrate in a reduced-pressure environment; generating a GCIB in the reduced-pressure environment from a pressurized gas mixture; selecting a beam acceleration potential and a beam dose to achieve a thickness of a thin film less than about 5 nm; accelerating the GCIB according to the beam acceleration potential; irradiating the accelerated GCIB onto at least a portion of the substrate according to the beam dose; and forming the thin film on the at least a portion of the substrate to achieve the thickness.

Herein, beam dose is given the units of number of clusters per unit area. However, beam dose may also include beam current and/or time (e.g., GCIB dwell time). For example, the beam current may be measured and maintained constant, while time is varied to change the beam dose. Alternatively, for example, the rate at which clusters strike the surface of the substrate per unit area (i.e., number of clusters per unit area per unit time) may be held constant while the time is varied to change the beam dose.

Additionally, other GCIB properties may be varied to adjust the film thickness, and other film properties such as the surface roughness, including, but not limited to, gas flow rate, stagnation pressure, cluster size, or gas nozzle design (such as nozzle throat diameter, nozzle length, and/or nozzle divergent section half-angle). Furthermore, other film properties may be varied by adjusting the GCIB properties including, but not limited to, film density, film quality, etc.

Figure 5:
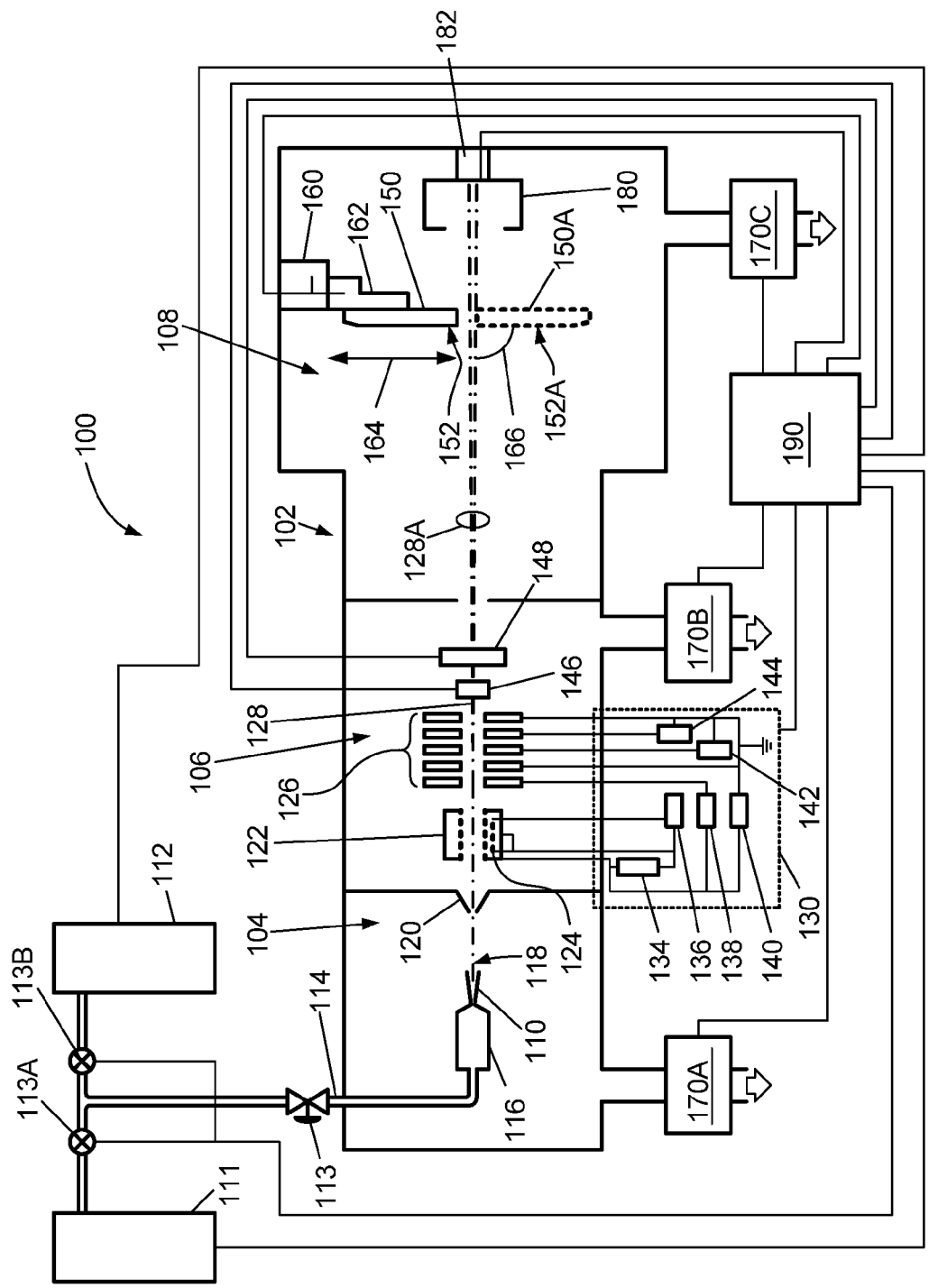
FIG. 5 is an illustration of a GCIB processing system.

Referring now to FIG. 5, a GCIB processing system 100 for forming the ultra-thin films as described above is depicted according to an embodiment. The GCIB processing system 100 comprises a vacuum vessel 102, substrate holder 150, upon which a substrate 152 to be processed is affixed, and vacuum pumping systems 170A, 170B, and 170C. Substrate 152 can be a semiconductor substrate, a wafer, a flat panel display (FPD), a liquid crystal display (LCD), or any other workpiece. GCIB processing system 100 is configured to produce a GCIB for treating substrate 152.

Referring still to GCIB processing system 100 in FIG. 5, the vacuum vessel 102 comprises three communicating chambers, namely, a source chamber 104, an ionization/acceleration chamber 106, and a processing chamber 108 to provide a reduced-pressure enclosure. The three chambers are evacuated to suitable operating pressures by vacuum pumping systems 170A, 170B, and 170C, respectively. In the three communicating chambers 104, 106, 108, a gas cluster beam can be formed in the first chamber (source chamber 104), while a GCIB can be formed in the second chamber (ionization/acceleration chamber 106) wherein the gas cluster beam is ionized and accelerated. Then, in the third chamber (processing chamber 108), the accelerated GCIB may be utilized to treat substrate 152.

As shown in FIG. 5, GCIB processing system 100 can comprise one or more gas sources configured to introduce one or more gases or mixture of gases to vacuum vessel 102. For example, a first gas composition stored in a first gas source 111 is admitted under pressure through a first gas control valve 113A to a gas metering valve or valves 113. Additionally, for example, a second gas composition stored in a second gas source 112 is admitted under pressure through a second gas control valve 113B to the gas metering valve or valves 113. Furthermore, for example, the first gas composition or the second gas composition or both can comprise a film-forming gas composition. Further yet, for example, the first gas composition or second gas composition or both can include a condensable inert gas, carrier gas or dilution gas. For example, the inert gas, carrier gas or dilution gas can include a noble gas, i.e., He, Ne, Ar, Kr, Xe, or Rn.

Furthermore, the first gas source 111 and the second gas source 112 may be utilized either alone or in combination with one another to produce ionized clusters. The film-forming composition can comprise a film precursor or precursors that include the principal atomic or molecular species of the film desired to be produced, deposited, or grown on the substrate.

The high pressure, condensable gas comprising the first gas composition or the second gas composition or both is introduced through gas feed tube 114 into stagnation chamber 116 and is ejected into the substantially lower pressure vacuum through a properly shaped nozzle 110. As a result of the expansion of the high pressure, condensable gas from the stagnation chamber 116 to the lower pressure region of the source chamber 104, the gas velocity accelerates to supersonic speeds and gas cluster beam 118 emanates from nozzle 110.

The inherent cooling of the jet as static enthalpy is exchanged for kinetic energy, which results from the expansion in the jet, causes a portion of the gas jet to condense and form a gas cluster beam 118 having clusters, each consisting of from several to several thousand weakly bound atoms or molecules. A gas skimmer 120, positioned downstream from the exit of the nozzle 110 between the source chamber 104 and ionization/acceleration chamber 106, partially separates the gas molecules on the peripheral edge of the gas cluster beam 118, that may not have condensed into a cluster, from the gas molecules in the core of the gas cluster beam 118, that may have formed clusters. Among other reasons, this selection of a portion of gas cluster beam 118 can lead to a reduction in the pressure in the downstream regions where higher pressures may be detrimental (e.g., ionizer 122, and processing chamber 108). Furthermore, gas skimmer 120 defines an initial dimension for the gas cluster beam entering the ionization/acceleration chamber 106.

After the gas cluster beam 118 has been formed in the source chamber 104, the constituent gas clusters in gas cluster beam 118 are ionized by ionizer 122 to form GCIB 128. The ionizer 122 may include an electron impact ionizer that produces electrons from one or more filaments 124, which are accelerated and directed to collide with the gas clusters in the gas cluster beam 118 inside the ionization/acceleration chamber 106. Upon collisional impact with the gas cluster, electrons of sufficient energy eject electrons from molecules in the gas clusters to generate ionized molecules. The ionization of gas clusters can lead to a population of charged gas cluster ions, generally having a net positive charge.

As shown in FIG. 5, beam electronics 130 are utilized to ionize, extract, accelerate, and focus the GCIB 128. The beam electronics 130 include a filament power supply 136 that provides voltage $V_F$ to heat the ionizer filament 124.

Additionally, the beam electronics 130 include a set of suitably biased high voltage electrodes 126 in the ionization/ acceleration chamber 106 that extracts the cluster ions from the ionizer 122. The high voltage electrodes 126 then accelerate the extracted cluster ions to a desired energy and focus them to define GCIB 128. The kinetic energy of the cluster ions in GCIB 128 typically ranges from about 1000 electron volts (1 keV) to several tens of keV. For example, GCIB 128 can be accelerated to 1 to 100 keV.

As illustrated in FIG. 5, the beam electronics 130 further include an anode power supply 134 that provides voltage $V_A$ to an anode of ionizer 122 for accelerating electrons emitted from filament 124 and causing the electrons to bombard the gas clusters in gas cluster beam 118, which produces cluster ions.

Additionally, as illustrated in FIG. 5, the beam electronics 130 include an extraction power supply 138 that provides voltage $V_E$ to bias at least one of the high voltage electrodes 126 to extract ions from the ionizing region of ionizer 122 and to form the GCIB 128. For example, extraction power supply 138 provides a voltage to a first electrode of the high voltage electrodes 126 that is less than or equal to the anode voltage of ionizer 122.

Furthermore, the beam electronics 130 can include an accelerator power supply 140 that provides voltage $V_{Acc}$ to bias one of the high voltage electrodes 126 with respect to the ionizer 122 so as to result in a total GCIB acceleration energy equal to about $V_{Acc}$ electron volts (eV). For example, accelerator power supply 140 provides a voltage to a second electrode of the high voltage electrodes 126 that is less than or equal to the anode voltage of ionizer 122 and the extraction voltage of the first electrode.

Further yet, the beam electronics 130 can include lens power supplies 142, 144 that may be provided to bias some of the high voltage electrodes 126 with potentials (e.g., $V_{L1}$ and $V_{L2}$) to focus the GCIB 128. For example, lens power supply 142 can provide a voltage to a third electrode of the high voltage electrodes 126 that is less than or equal to the anode voltage of ionizer 122, the extraction voltage of the first electrode, and the accelerator voltage of the second electrode, and lens power supply 144 can provide a voltage to a fourth electrode of the high voltage electrodes 126 that is less than or equal to the anode voltage of ionizer 122, the extraction voltage of the first electrode, the accelerator voltage of the second electrode, and the first lens voltage of the third electrode.

Note that many variants on both the ionization and extraction schemes may be used. While the scheme described here is useful for purposes of instruction, another extraction scheme involves placing the ionizer and the first element of the extraction electrode(s) (or extraction optics) at $V_{Acc}$. This typically requires fiber optic programming of control voltages for the ionizer power supply, but creates a simpler overall optics train. The invention described herein is useful regardless of the details of the ionizer and extraction lens biasing.

A beam filter 146 in the ionization/acceleration chamber 106 downstream of the high voltage electrodes 126 can be utilized to eliminate monomers, or monomers and light cluster ions from the GCIB 128 to define a filtered process GCIB 128A that enters the processing chamber 108. In one embodiment, the beam filter 146 substantially reduces the number of clusters having 100 or less atoms or molecules or both. The beam filter may comprise a magnet assembly for imposing a magnetic field across the GCIB 128 to aid in the filtering process.

Referring still to FIG. 5, a beam gate 148 is disposed in the path of GCIB 128 in the ionization/acceleration chamber 106. Beam gate 148 has an open state in which the GCIB 128 is permitted to pass from the ionization/acceleration chamber 106 to the processing chamber 108 to define process GCIB 128A, and a closed state in which the GCIB 128 is blocked from entering the processing chamber 108. A control cable conducts control signals from control system 190 to beam gate 148. The control signals controllably switch beam gate 148 between the open or closed states.

A substrate 152, which may be a wafer or semiconductor wafer, a flat panel display (FPD), a liquid crystal display (LCD), or other substrate to be processed by GCIB processing, is disposed in the path of the process GCIB 128A in the processing chamber 108. Because most applications contemplate the processing of large substrates with spatially uniform results, a scanning system may be desirable to uniformly scan the process GCIB 128A across large areas to produce spatially homogeneous results.

An X-scan actuator 160 provides linear motion of the substrate holder 150 in the direction of X-scan motion (into and out of the plane of the paper). A Y-scan actuator 162 provides linear motion of the substrate holder 150 in the direction of Y-scan motion 164, which is typically orthogonal to the X-scan motion. The combination of X-scanning and Y-scanning motions translates the substrate 152, held by the substrate holder 150, in a raster-like scanning motion through process GCIB 128A to cause a uniform (or otherwise programmed) irradiation of a surface of the substrate 152 by the process GCIB 128A for processing of the substrate 152.

The substrate holder 150 disposes the substrate 152 at an angle with respect to the axis of the process GCIB 128A so that the process GCIB 128A has an angle of beam incidence 166 with respect to a substrate 152 surface. The angle of beam incidence 166 may be 90 degrees or some other angle, but is typically 90 degrees or near 90 degrees. During Y-scanning, the substrate 152 and the substrate holder 150 move from the shown position to the alternate position "A" indicated by the designators 152A and 150A, respectively. Notice that in moving between the two positions, the substrate 152 is scanned through the process GCIB 128A, and in both extreme positions, is moved completely out of the path of the process GCIB 128A (over-scanned). Though not shown explicitly in FIG. 5, similar scanning and over-scan is performed in the (typically) orthogonal X-scan motion direction (in and out of the plane of the paper).

A beam current sensor 180 may be disposed beyond the substrate holder 150 in the path of the process GCIB 128A so as to intercept a sample of the process GCIB 128A when the substrate holder 150 is scanned out of the path of the process GCIB 128A. The beam current sensor 180 is typically a Faraday cup or the like, closed except for a beam-entry opening, and is typically affixed to the wall of the vacuum vessel 102 with an electrically insulating mount 182.

As shown in FIG. 5, control system 190 connects to the X-scan actuator 160 and the Y-scan actuator 162 through electrical cable and controls the X-scan actuator 160 and the Y-scan actuator 162 in order to place the substrate 152 into or out of the process GCIB 128A and to scan the substrate 152 uniformly relative to the process GCIB 128A to achieve desired processing of the substrate 152 by the process GCIB 128A. Control system 190 receives the sampled beam current collected by the beam current sensor 180 by way of an electrical cable and, thereby, monitors the GCIB and controls the GCIB dose received by the substrate 152 by removing the substrate 152 from the process GCIB 128A when a predetermined dose has been delivered.

Figure 6:
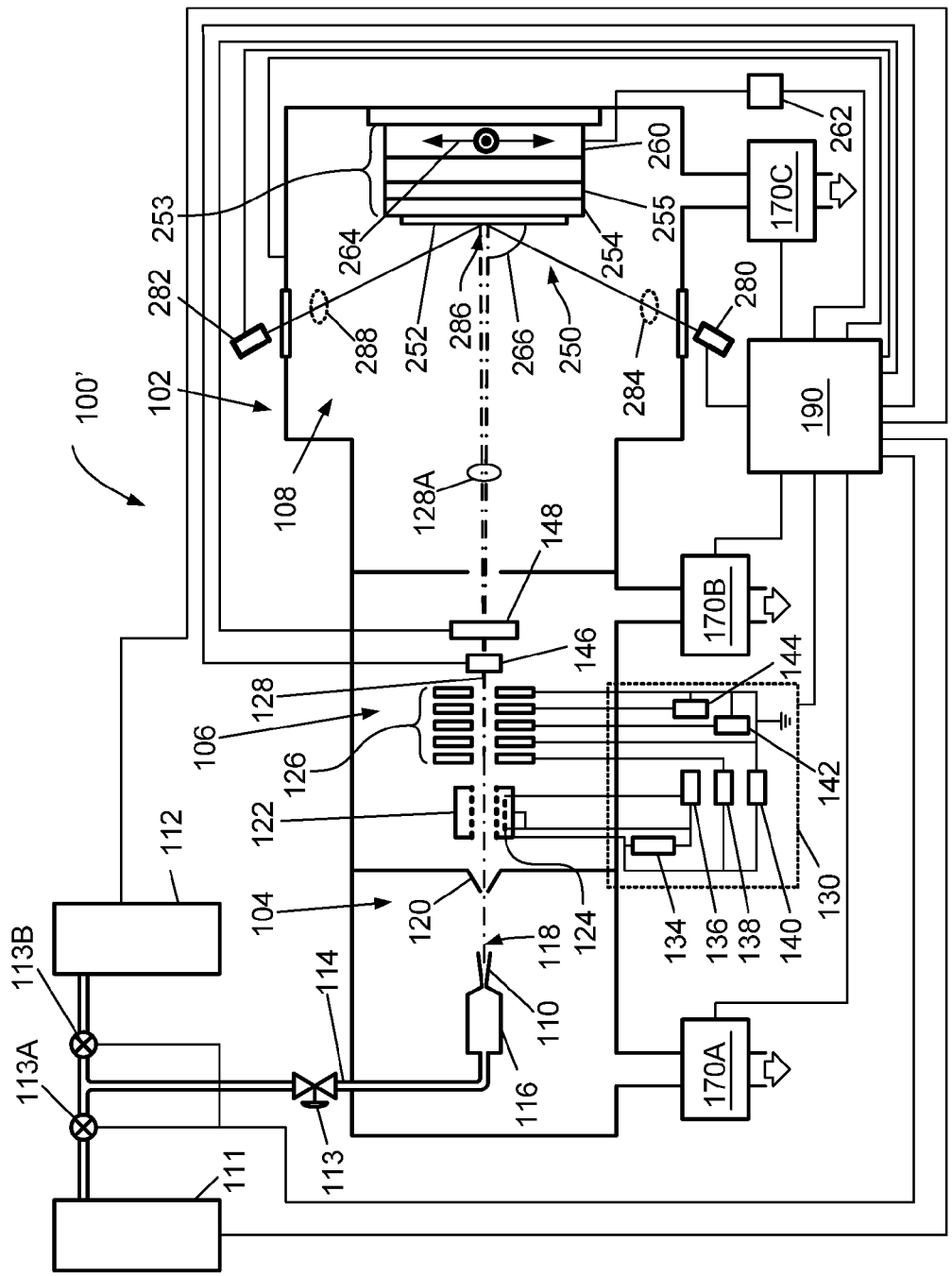
FIG. 6 is another illustration of a GCIB processing system.

In the embodiment shown in FIG. 6, the GCIB processing system 100' can be similar to the embodiment of FIG. 5 and further comprise a X-Y positioning table 253 operable to hold and move a substrate 252 in two axes, effectively scanning the substrate 252 relative to the process GCIB 128A. For example, the X-motion can include motion into and out of the plane of the paper, and the Y-motion can include motion along direction 264.

The process GCIB 128A impacts the substrate 252 at a projected impact region 286 on a surface of the substrate 252, and at an angle of beam incidence 266 with respect to the surface of substrate 252. By X-Y motion, the X-Y positioning table 253 can position each portion of a surface of the substrate 252 in the path of process GCIB 128A so that every region of the surface may be made to coincide with the projected impact region 286 for processing by the process GCIB 128A. An X-Y controller 262 provides electrical signals to the X-Y positioning table 253 through an electrical cable for controlling the position and velocity in each of X-axis and Y-axis directions. The X-Y controller 262 receives control signals from, and is operable by, control system 190 through an electrical cable. X-Y positioning table 253 moves by continuous motion or by stepwise motion according to conventional X-Y table positioning technology to position different regions of the substrate 252 within the projected impact region 286. In one embodiment, X-Y positioning table 253 is programmably operable by the control system 190 to scan, with programmable velocity, any portion of the substrate 252 through the projected impact region 286 for GCIB processing by the process GCIB 128A.

The substrate holding surface 254 of positioning table 253 is electrically conductive and is connected to a dosimetry processor operated by control system 190. An electrically insulating layer 255 of positioning table 253 isolates the substrate 252 and substrate holding surface 254 from the base portion 260 of the positioning table 253. Electrical charge induced in the substrate 252 by the impinging process GCIB 128A is conducted through substrate 252 and substrate holding surface 254, and a signal is coupled through the positioning table 253 to control system 190 for dosimetry measurement. Dosimetry measurement has integrating means for integrating the GCIB current to determine a GCIB processing dose. Under certain circumstances, a target-neutralizing source (not shown) of electrons, sometimes referred to as electron flood, may be used to neutralize the process GCIB 128A. In such case, a Faraday cup (not shown, but which may be similar to beam current sensor 180 in FIG. 5) may be used to assure accurate dosimetry despite the added source of electrical charge, the reason being that typical Faraday cups allow only the high energy positive ions to enter and be measured.

In operation, the control system 190 signals the opening of the beam gate 148 to irradiate the substrate 252 with the process GCIB 128A. The control system 190 monitors measurements of the GCIB current collected by the substrate 252 in order to compute the accumulated dose received by the substrate 252. When the dose received by the substrate 252 reaches a predetermined dose, the control system 190 closes the beam gate 148 and processing of the substrate 252 is complete. Based upon measurements of the GCIB dose received for a given area of the substrate 252, the control system 190 can adjust the scan velocity in order to achieve an appropriate beam dwell time to treat different regions of the substrate 252.

Alternatively, the process GCIB 128A may be scanned at a constant velocity in a fixed pattern across the surface of the substrate 252; however, the GCIB intensity is modulated (may be referred to as Z-axis modulation) to deliver an intentionally non-uniform dose to the sample. The GCIB intensity may be modulated in the GCIB processing system 100' by any of a variety of methods, including varying the gas flow from a GCIB source supply; modulating the ionizer 122 by either varying a filament voltage $V_F$ or varying an anode voltage $V_A$; modulating the lens focus by varying lens voltages $V_{L1}$ and/or $V_{L2}$; or mechanically blocking a portion of the GCIB with a variable beam block, adjustable shutter, or variable aperture. The modulating variations may be continuous analog variations or may be time modulated switching or gating.

The processing chamber 108 may further include an in-situ metrology system. For example, the in-situ metrology system may include an optical diagnostic system having an optical transmitter 280 and optical receiver 282 configured to illuminate substrate 252 with an incident optical signal 284 and to receive a scattered optical signal 288 from substrate 252, respectively. The optical diagnostic system comprises optical windows to permit the passage of the incident optical signal 284 and the scattered optical signal 288 into and out of the processing chamber 108. Furthermore, the optical transmitter 280 and the optical receiver 282 may comprise transmitting and receiving optics, respectively. The optical transmitter 280 receives, and is responsive to, controlling electrical signals from the control system 190. The optical receiver 282 returns measurement signals to the control system 190.

The in-situ metrology system may comprise any instrument configured to monitor the progress of the GCIB processing. According to one embodiment, the in-situ metrology system may constitute an optical scatterometry system. The scatterometry system may include a scatterometer, incorporating beam profile ellipsometry (ellipsometer) and beam profile reflectometry (reflectometer), commercially available from Therma-Wave, Inc. (1250 Reliance Way, Fremont, Calif. 94539) or Nanometrics, Inc. (1550 Buckeye Drive, Milpitas, Calif. 95035).

For instance, the in-situ metrology system may include an integrated Optical Digital Profilometry (iODP) scatterometry module configured to measure process performance data resulting from the execution of a treatment process in the GCIB processing system 100'. The metrology system may, for example, measure or monitor metrology data resulting from the treatment process. The metrology data can, for example, be utilized to determine process performance data that characterizes the treatment process, such as a process rate, a relative process rate, a feature profile angle, a critical dimension, a feature thickness or depth, a feature shape, etc. For example, in a process for directionally depositing material on a substrate, process performance data can include a critical dimension (CD), such as a top, middle or bottom CD in a feature (i.e., via, line, etc.), a feature depth, a material thickness, a sidewall angle, a sidewall shape, a deposition rate, a relative deposition rate, a spatial distribution of any parameter thereof, a parameter to characterize the uniformity of any spatial distribution thereof, etc. Operating the X-Y positioning table 253 via control signals from control system 190, the in-situ metrology system can map one or more characteristics of the substrate 252.

Figure 7:
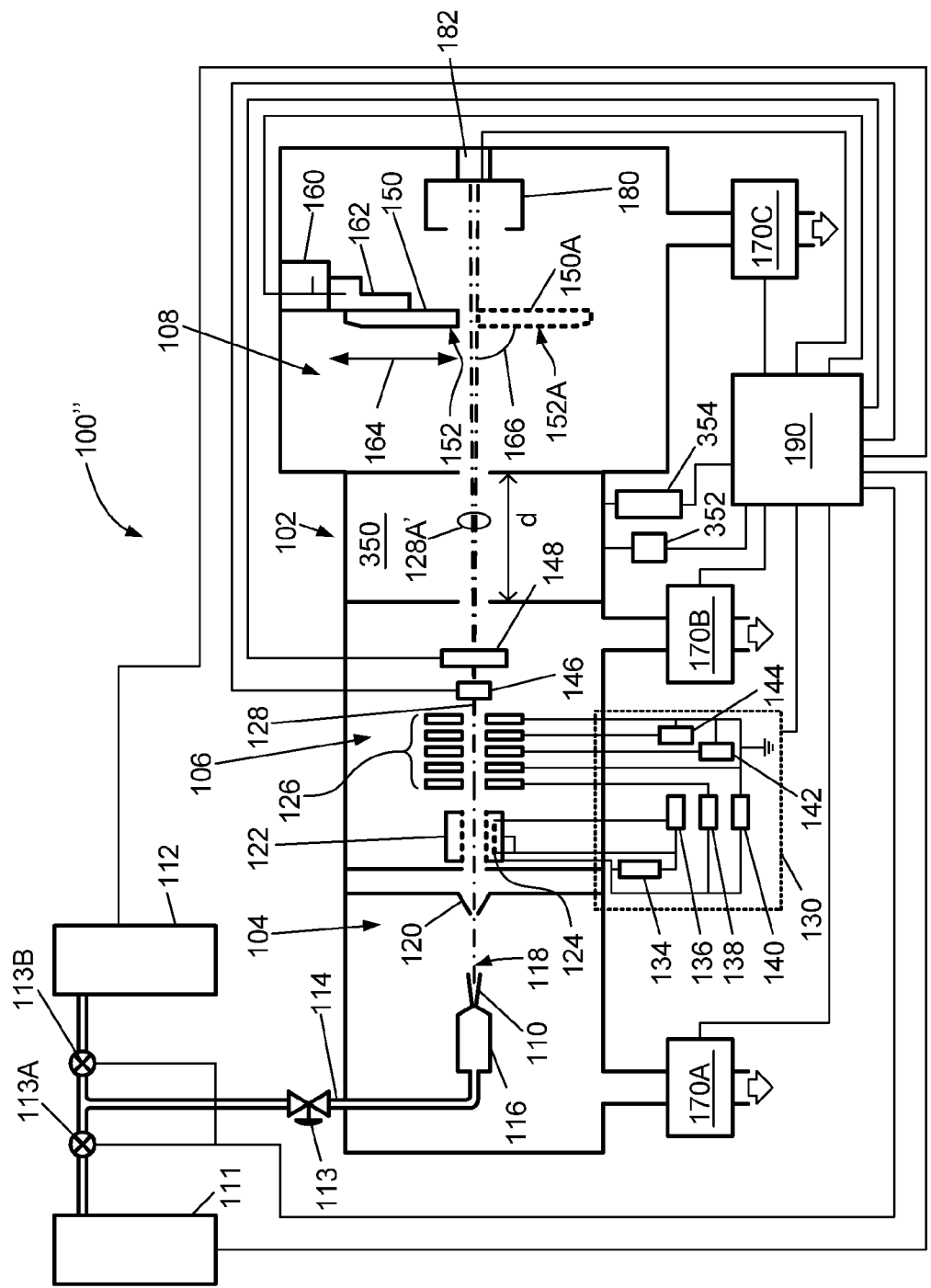
FIG. 7 is yet another illustration of a GCIB processing system.

In the embodiment shown in FIG. 7, the GCIB processing system 100" can be similar to the embodiment of FIG. 5 and further comprise a pressure cell chamber 350 positioned, for example, at or near an outlet region of the ionization/acceleration chamber 106. The pressure cell chamber 350 comprises an inert gas source 352 configured to supply a background gas to the pressure cell chamber 350 for elevating the pressure in the pressure cell chamber 350, and a pressure sensor 354 configured to measure the elevated pressure in the pressure cell chamber 350.

The pressure cell chamber 350 may be configured to modify the beam energy distribution of GCIB 128 to produce a modified processing GCIB 128A'. This modification of the beam energy distribution is achieved by directing GCIB 128 along a GCIB path through an increased pressure region within the pressure cell chamber 350 such that at least a portion of the GCIB traverses the increased pressure region. The extent of modification to the beam energy distribution may be characterized by a pressure-distance integral along that portion of the GCIB path, where distance (or length of the pressure cell chamber 350) is indicated by path length (d). When the value of the pressure-distance integral is increased (either by increasing the pressure and/or the path length (d)), the beam energy distribution is broadened and the peak energy is decreased. When the value of the pressure-distance integral is decreased (either by decreasing the pressure and/or the path length (d)), the beam energy distribution is narrowed and the peak energy is increased. Further details for the design of a pressure cell may be determined from U.S. Pat. No. 7,060,989, entitled METHOD AND APPARATUS FOR IMPROVED PROCESSING WITH A GAS-CLUSTER ION BEAM; the content of which is incorporated herein by reference in its entirety.

Control system 190 comprises a microprocessor, memory, and a digital I/O port capable of generating control voltages sufficient to communicate and activate inputs to GCIB processing system 100 (or 100', 100"), as well as monitor outputs from GCIB processing system 100 (or 100', 100"). Moreover, control system 190 can be coupled to and can exchange information with vacuum pumping systems 170A, 170B, and 170C, first gas source 111, second gas source 112, first gas control valve 113A, second gas control valve 113B, beam electronics 130, beam filter 146, beam gate 148, the X-scan actuator 160, the Y-scan actuator 162, and beam current sensor 180. For example, a program stored in the memory can be utilized to activate the inputs to the aforementioned components of GCIB processing system 100 according to a process recipe in order to perform a GCIB process on substrate 152.

However, the control system 190 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The control system 190 can be used to configure any number of processing elements, as described above, and the control system 190 can collect, provide, process, store, and display data from processing elements. The control system 190 can include a number of applications, as well as a number of controllers, for controlling one or more of the processing elements. For example, control system 190 can include a graphic user interface (GUI) component (not shown) that can provide interfaces that enable a user to monitor and/or control one or more processing elements.

Control system 190 can be locally located relative to the GCIB processing system 100 (or 100', 100"), or it can be remotely located relative to the GCIB processing system 100 (or 100', 100"). For example, control system 190 can exchange data with GCIB processing system 100 using a direct connection, an intranet, and/or the internet. Control system 190 can be coupled to an intranet at, for example, a customer site (i.e., a device maker, etc.), or it can be coupled to an intranet at, for example, a vendor site (i.e., an equipment manufacturer). Alternatively or additionally, control system 190 can be coupled to the internet. Furthermore, another computer (i.e., controller, server, etc.) can access control system 190 to exchange data via a direct connection, an intranet, and/or the internet.

Substrate 152 (or 252) can be affixed to the substrate holder 150 (or substrate holder 250) via a clamping system (not shown), such as a mechanical clamping system or an electrical clamping system (e.g., an electrostatic clamping system). Furthermore, substrate holder 150 (or 250) can include a heating system (not shown) or a cooling system (not shown) that is configured to adjust and/or control the temperature of substrate holder 150 (or 250) and substrate 152 (or 252).

Vacuum pumping systems 170A, 170B, and 170C can include turbo-molecular vacuum pumps (TMP) capable of pumping speeds up to about 5000 liters per second (and greater) and a gate valve for throttling the chamber pressure. In conventional vacuum processing devices, a 1000 to 3000 liter per second TMP can be employed. TMPs are useful for low pressure processing, typically less than about 50 mTorr. Although not shown, it may be understood that pressure cell chamber 350 may also include a vacuum pumping system. Furthermore, a device for monitoring chamber pressure (not shown) can be coupled to the vacuum vessel 102 or any of the three vacuum chambers 104, 106, 108. The pressure-measuring device can be, for example, a capacitance manometer or ionization gauge.

Figure 8:
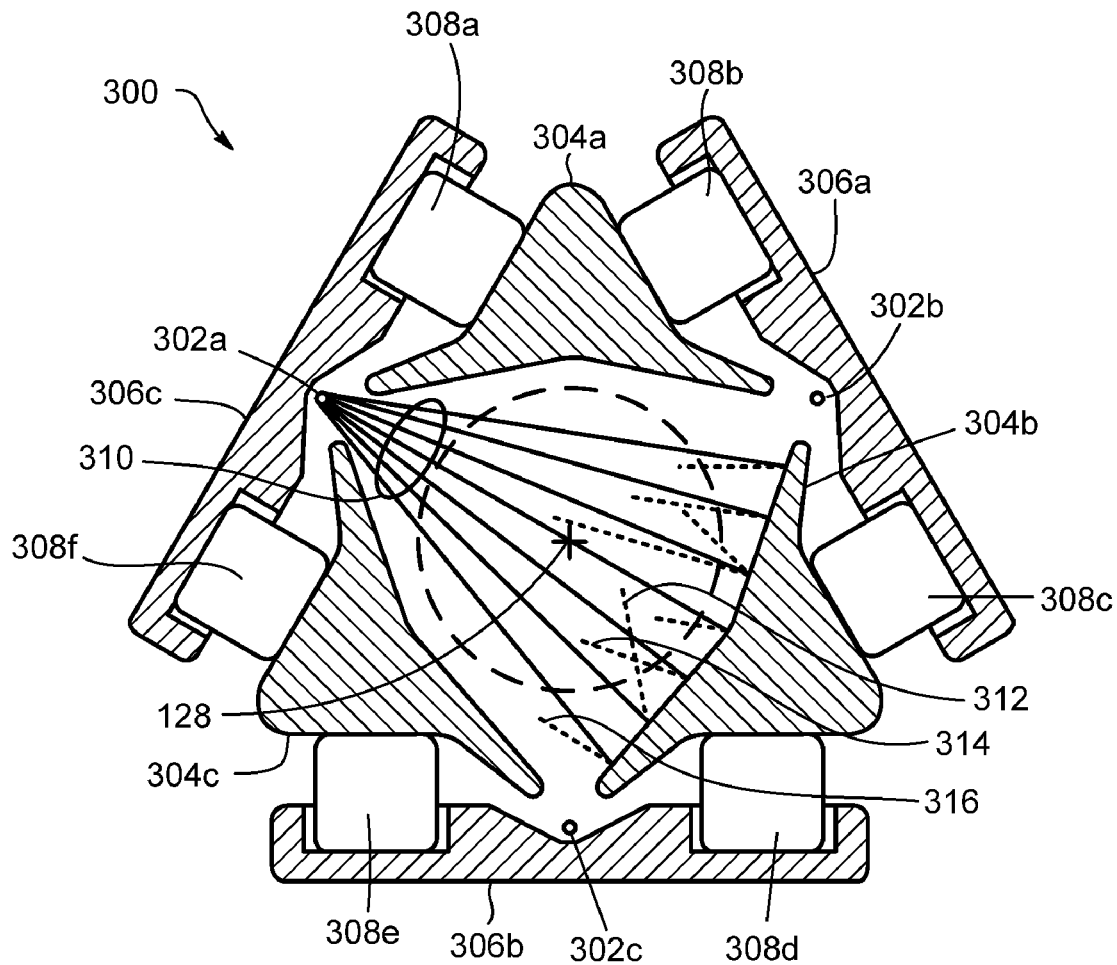
FIG. 8 is an illustration of an ionization source for a GCIB processing system.

Referring now to FIG. 8, a section 300 of a gas cluster ionizer (122, FIGS. 5, 6 and 7) for ionizing a gas cluster jet (gas cluster beam 118, FIGS. 5, 6 and 7) is shown. The section 300 is normal to the axis of GCIB 128. For typical gas cluster sizes (2000 to 15000 atoms), clusters leaving the skimmer (120, FIGS. 5, 6 and 7) aperture and entering an ionizer (122, FIGS. 5, 6 and 7) will travel with a kinetic energy of about 130 to 1000 electron volts (eV). At these low energies, any departure from space charge neutrality within the ionizer 122 will result in a rapid dispersion of the jet with a significant loss of beam current. FIG. 8 illustrates a self-neutralizing ionizer. As with other ionizers, gas clusters are ionized by electron impact. In this design, thermo-electrons (seven examples indicated by 310) are emitted from multiple linear thermionic filaments 302a, 302b, and 302c (typically tungsten) and are extracted and focused by the action of suitable electric fields provided by electron-repeller electrodes 306a, 306b, and 306c and beam-forming electrodes 304a, 304b, and 304c. Thermo-electrons 310 pass through the gas cluster jet and the jet axis and then strike the opposite beam-forming electrode 304b to produce low energy secondary electrons (312, 314, and 316 indicated for examples).

Though (for simplicity) not shown, linear thermionic filaments 302b and 302c also produce thermo-electrons that subsequently produce low energy secondary electrons. All the secondary electrons help ensure that the ionized cluster jet remains space charge neutral by providing low energy electrons that can be attracted into the positively ionized gas cluster jet as required to maintain space charge neutrality. Beam-forming electrodes 304a, 304b, and 304c are biased positively with respect to linear thermionic filaments 302a, 302b, and 302c and electron-repeller electrodes 306a, 306b, and 306c are negatively biased with respect to linear thermionic filaments 302a, 302b, and 302c. Insulators 308a, 308b, 308c, 308d, 308e, and 308f electrically insulate and support electrodes 304a, 304b, 304c, 306a, 306b, and 306c. For example, this self-neutralizing ionizer is effective and achieves over 1000 micro Amps argon GCIBs.

Alternatively, ionizers may use electron extraction from plasma to ionize clusters. The geometry of these ionizers is quite different from the three filament ionizer described here but the principles of operation and the ionizer control are very similar. For example, the ionizer design may be similar to the ionizer described in U.S. Pat. No. 7,173,252, entitled IONIZER AND METHOD FOR GAS-CLUSTER ION-BEAM FORMATION; the content of which is incorporated herein by reference in its entirety.

The gas cluster ionizer (122, FIGS. 5, 6 and 7) may be configured to modify the beam energy distribution of GCIB 128 by altering the charge state of the GCIB 128. For example, the charge state may be modified by adjusting an electron flux, an electron energy, or an electron energy distribution for electrons utilized in electron collision-induced ionization of gas clusters.

According to an embodiment, a GCIB is utilized to form a thin film on a surface of a substrate. For example, the GCIB may be generated using any one of the GCIB processing systems (100, 100', or 100", or combinations thereof) depicted in FIGS. 5, 6 and 7. The forming of a thin film may include growing a thin film and/or depositing a thin film.

When growing a thin film, the forming of a thin film may include oxidation, nitridation, or oxynitridation of a substrate or layer on a substrate. Additionally, the forming of a thin film may include growing a $SiO_x$, $SiN_x$, $SiC_x$, $SiO_xN_y$, $SiO_xC_y$, or $SiC_xN_y$ film on a substrate or layer on a substrate. Additionally yet, the forming of a thin film may include growing a germanide. According to embodiments of the invention, the pressurized gas mixture may thus comprise an oxygen-containing gas, a nitrogen-containing gas, a carbon-containing gas, a hydrogen-containing gas, a silicon-containing gas, or a germanium-containing gas, or a combination of two or more thereof.

When growing an oxide such as $SiO_x$, a substrate comprising silicon or a silicon-containing material may be irradiated by a GCIB formed from a pressurized gas mixture having an oxygen-containing gas. For example, the pressurized gas mixture may comprise $O_2$. In another example, the pressurized gas mixture may comprise $O_2$, NO, $NO_2$, $N_2O$, CO, or $CO_2$, or any combination of two or more thereof.

When growing a nitride such as $SiN_x$, a substrate comprising silicon or a silicon-containing material may be irradiated by a GCIB formed from a pressurized gas mixture having a nitrogen-containing gas. For example, the pressurized gas mixture may comprise $N_2$. In another example, the pressurized gas mixture may comprise $N_2$, NO, $NO_2$, $N_2O$, or $NH_3$, or any combination of two or more thereof.

When growing a carbide such as $SiC_x$, a substrate comprising silicon or a silicon-containing material, may be irradiated by a GCIB formed from a pressurized gas mixture having a carbon-containing gas. For example, the pressurized gas mixture may comprise $CH_4$. In another example, the pressurized gas mixture may comprise $CH_4$ (or more generally a hydrocarbon gas, i.e., $C_xH_y$), CO, or $CO_2$, or any combination of two or more thereof.

When growing an oxynitride such as $SiO_xN_y$, a substrate comprising silicon or a silicon-containing material may be irradiated by a GCIB formed from a pressurized gas mixture having an oxygen-containing gas and a nitrogen-containing gas. For example, the pressurized gas mixture may comprise $O_2$ and $N_2$, NO, $NO_2$, or $N_2O$, or any combination of two or more thereof.

When growing a carbonitride such as $SiC_xN_y$, a substrate comprising silicon or a silicon-containing material may be irradiated by a GCIB formed from a pressurized gas mixture having a carbon-containing gas and a nitrogen-containing gas. For example, the pressurized gas mixture may comprise $CH_4$ and $N_2$.

When growing a germanide such as SiGe, a substrate comprising silicon or a silicon-containing material may be irradiated by a GCIB formed from a pressurized gas mixture having a germanium-containing gas. For example, the pressurized gas mixture may comprise $GeH_4$ or $Ge_2H_6$, or both.

When depositing a thin film, the forming of a thin film may include depositing a $SiO_x$, $SiN_x$, $SiC_x$, $SiO_xN_y$, $SiC_xN_y$, $SiO_xC_y$, $SiO_xC_yN_z$, a-C, $BN_x$, $BSi_xN_y$, Ge, SiGe(B), or SiC(P) film on a substrate or layer on a substrate. According to embodiments of the invention, the pressurized gas mixture may thus comprise an oxygen-containing gas, a nitrogen-containing gas, a carbon-containing gas, a boron-containing gas, a silicon-containing gas, a phosphorous-containing gas, a sulfur-containing gas, a hydrogen-containing gas, an arsenic-containing gas, or a germanium-containing gas, or a combination of two or more thereof.

When depositing silicon, a substrate may be irradiated by a GCIB formed from a pressurized gas mixture having a silicon-containing gas. For example, the pressurized gas mixture may comprise silane ($SiH_4$). In another example, the pressurized gas mixture may comprise disilane ($Si_2H_6$), dichlorosilane ($SiH_2Cl_2$), trichlorosilane ($SiCl_3H$), diethylsilane ($C_4H_{12}Si$), trimethylsilane ($C_3H_{10}Si$), silicon tetrachloride ($SiCl_4$), silicon tetrafluoride ($SiF_4$), or a combination of two or more thereof.

When depositing a nitride such as $SiN_x$, a substrate may be irradiated by a GCIB formed from a pressurized gas mixture having a silicon-containing gas and a nitrogen-containing gas. For example, the pressurized gas mixture may comprise silane ($SiH_4$) and $N_2$. In another example, the pressurized gas mixture may comprise $N_2$, NO, $NO_2$, $N_2O$, or $NH_3$, or any combination of two or more thereof.

When depositing a carbide such as $SiC_x$, a substrate may be irradiated by a GCIB formed from a pressurized gas mixture having a silicon-containing gas and a carbon-containing gas. For example, the pressurized gas mixture may comprise silane ($SiH_4$) and $CH_4$. Additionally, for example, the pressurized gas mixture may comprise silane ($SiH_4$) and methylsilane ($H_3C$—$SiH_3$). Furthermore, for example, the pressurized gas mixture may comprise a silicon-containing gas and $CH_4$ (or more generally a hydrocarbon gas, i.e., $C_xH_y$), CO, or $CO_2$, or any combination of two or more thereof. Further yet, for example, the pressurized gas mixture may comprise an alkyl silane, an alkane silane, an alkene silane, or an alkyne silane, or any combination of two or more thereof. Additionally, for example, the pressurized gas mixture may include silane, methylsilane ($H_3C$—$SiH_3$), dimethylsilane ($H_3C$—$SiH_2$—$CH_3$), trimethylsilane (($CH_3)_3$—SiH), or tetramethylsilane (($CH_3)_4$—Si), or any combination of two or more thereof. When forming a carbonitride such as $SiC_xN_y$, the pressurized gas may further comprise a nitrogen-containing gas. For example, the nitrogen-containing gas may include $N_2$, $NH_3$, $NF_3$, NO, $N_2O$, or $NO_2$, or a combination of two or more thereof. The addition of a nitrogen-containing gas may permit forming a silicon carbonitride film (SiCN).

When forming a nitride such as $BN_x$, a substrate may be irradiated by a GCIB formed from a pressurized gas mixture having a boron-containing gas and a nitrogen-containing gas. For example, the pressurized gas mixture may comprise diborane ($B_2H_6$) and $N_2$. In another example, the pressurized gas mixture may comprise $N_2$, NO, $NO_2$, $N_2O$, or $NH_3$, or any combination of two or more thereof.

When forming a nitride such as $BSi_xN_y$, a substrate may be irradiated by a GCIB formed from a pressurized gas mixture having a silicon-containing gas, a boron-containing gas, and a nitrogen-containing gas. For example, the pressurized gas mixture may comprise silane ($SiH_4$), diborane ($B_2H_6$) and $N_2$. In another example, the pressurized gas mixture may comprise $N_2$, NO, $NO_2$, $N_2O$, or $NH_3$, or any combination of two or more thereof.

In any one of the above examples, the pressurized gas mixture may comprise an optional inert gas. The optional inert gas may comprise a noble gas.

According to an example, $SiO_2$ was grown on a silicon substrate by irradiating the substrate with a GCIB formed from a pressurized gas mixture containing $O_2$. Film thickness (measured in angstroms, Å) and surface roughness (measured in angstrom, Å) were collected and are provided in FIG. 9. The data provided in FIG. 9 was obtained using a GCIB processing system having a three (3)-electrode beam line. For example, the set of suitably biased high voltage electrodes, illustrated in FIGS. 5 through 7, included a three electrode arrangement having an extraction electrode (positively biased), a suppression electrode (negatively biased) and a ground electrode.

The film thickness of the grown film is provided as a function of the beam acceleration potential (measured in kV) (i.e., beam energy) and process time (measured in minutes, min) (i.e., beam dose). In each case, the thickness increased as a function of process time (or beam dose) until it eventually saturated. The maximum thickness and the elapsed process time associated with substantially achieving the maximum thickness depended on the beam acceleration potential. As the beam acceleration potential was increased, the maximum thickness increased and the time to achieve the maximum thickness decreased. Conversely, as the beam acceleration potential was decreased, the maximum thickness decreased and the time to achieve the maximum thickness increased.

Additionally, the surface roughness (average roughness, $R_a$) depended on the beam acceleration potential. As the beam acceleration was increased, the surface roughness increased. Conversely, as the beam acceleration was decreased, the surface roughness decreased.

As demonstrated by the data in FIG. 9, when the beam acceleration potential is reduced to below about 5 kV, ultra-thin films of moderate surface roughness may be achieved. For example, when the beam acceleration potential is at or below about 3 kV, sub-50 Å films having a surface roughness at or below 4 Å may be achieved. However, higher beam acceleration potentials may be used.

Furthermore, for a given film thickness, the surface roughness may be decreased by modifying the beam energy distribution function. With the exception of a few data sets, each data set was acquired using a GCIB processing system without modification of the beam energy distribution function, e.g., without a pressure cell having an increased pressure region through which the GCIB passes. In the case of the exceptions, the beam energy distribution function of the GCIB was modified by directing the GCIB along a GCIB path through an increased pressure. In one case, the path length (d) of the pressure cell was set to d~23.3 cm and the pressure in the pressure cell was elevated by introducing a background gas. For example, in one case, the background gas was introduced at a flow rate of 15 sccm (standard cubic centimeters per minute) ("15P") (or the pressure-distance integral was about 0.002 torr-cm) to the pressure cell or, in another case, the background gas was introduced at a flow rate of 40 sccm ("40P") (or the pressure-distance integral was about 0.005 torr-cm) to the pressure cell.

Figure 9:
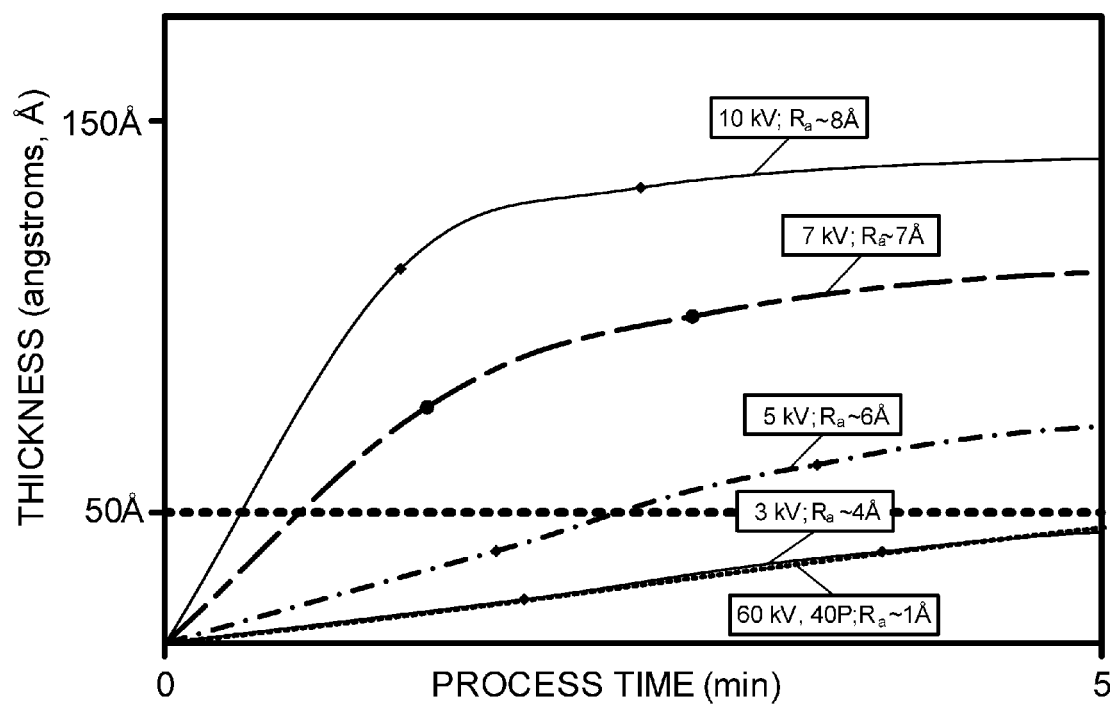
FIGS. 9-11 are graphs that each provide exemplary data for thin film formation using a GCIB.

As shown in FIG. 9, the modification of the beam energy distribution function may be used to reduce the surface roughness while maintaining about the same film thickness (by increasing the beam acceleration potential). For example, when the beam acceleration was increased to 60 kV and the pressure in the pressure cell was set to "40P", the resultant film thickness as a function of process time nearly coincided with the film thickness measured for a 3 kV beam acceleration potential without the use of the pressure cell. However, with the use of the pressure cell, the surface roughness was reduced from about 4 Å to about 1 Å.

Figure 10:
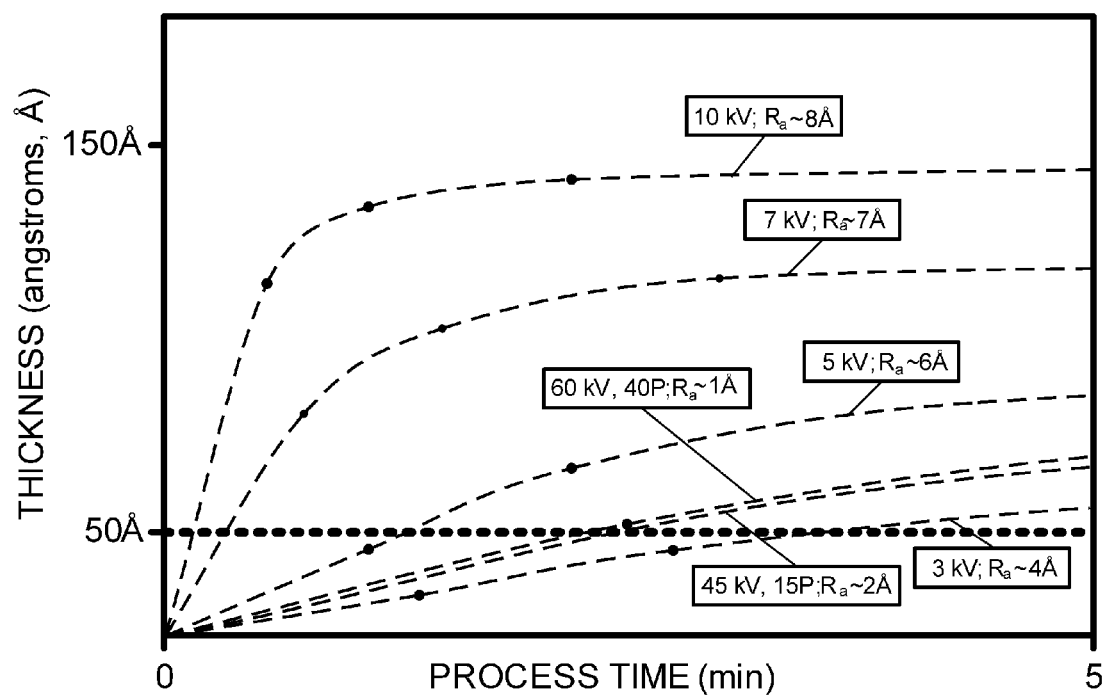

According to another example, $SiO_2$ was grown on a silicon substrate by irradiating the substrate with a GCIB formed from a pressurized gas mixture containing $O_2$. Film thickness (measured in angstrom, Å) and surface roughness (measured in angstroms, Å) were collected and are provided in FIG. 10. The data provided in FIG. 10 is similar to that of FIG. 9; however, the data was obtained using a GCIB processing system having a five (5)-electrode beam line. For example, the set of suitably biased high voltage electrodes resemble the electrode system illustrated in FIGS. 5 through 7.

As shown in FIG. 10, the thickness increased as a function of process time (or beam dose) until it eventually saturated. The maximum thickness and the elapsed process time associated with substantially achieving the maximum thickness depended on the beam acceleration potential. Additionally, the surface roughness (average roughness, $R_a$) depended on the beam acceleration potential. As the beam acceleration potential was increased, the surface roughness increased. Conversely, as the beam acceleration potential was decreased, the surface roughness decreased.

Also, as shown in FIG. 10, the modification of the beam energy distribution function may be used to reduce the surface roughness while maintaining about the same film thickness (by increasing the beam acceleration potential). For example, when the beam acceleration is increased to 60 kV and the pressure in the pressure cell is set to "40P", an ultra-thin film may be grown having a thickness less than about 50 Å and a surface roughness of about 1 Å.

According to other examples, $SiC_x$ and SiN have been deposited on a substrate by irradiating the substrate with a GCIB formed from a pressurized gas mixture containing $SiH_4$ and $CH_4$ or $N_2$, respectively. Film thickness (measured in angstrom, Å) and surface roughness (measured in angstroms, Å) may be collected and presented in a manner similar to that provided in FIG. 11. The data can be obtained using a GCIB processing system having a three (3)-electrode, or a five (5)-electrode beam line. For example, the set of suitably biased high voltage electrodes resemble the electrode system illustrated in FIGS. 5 through 7.

Figure 11:
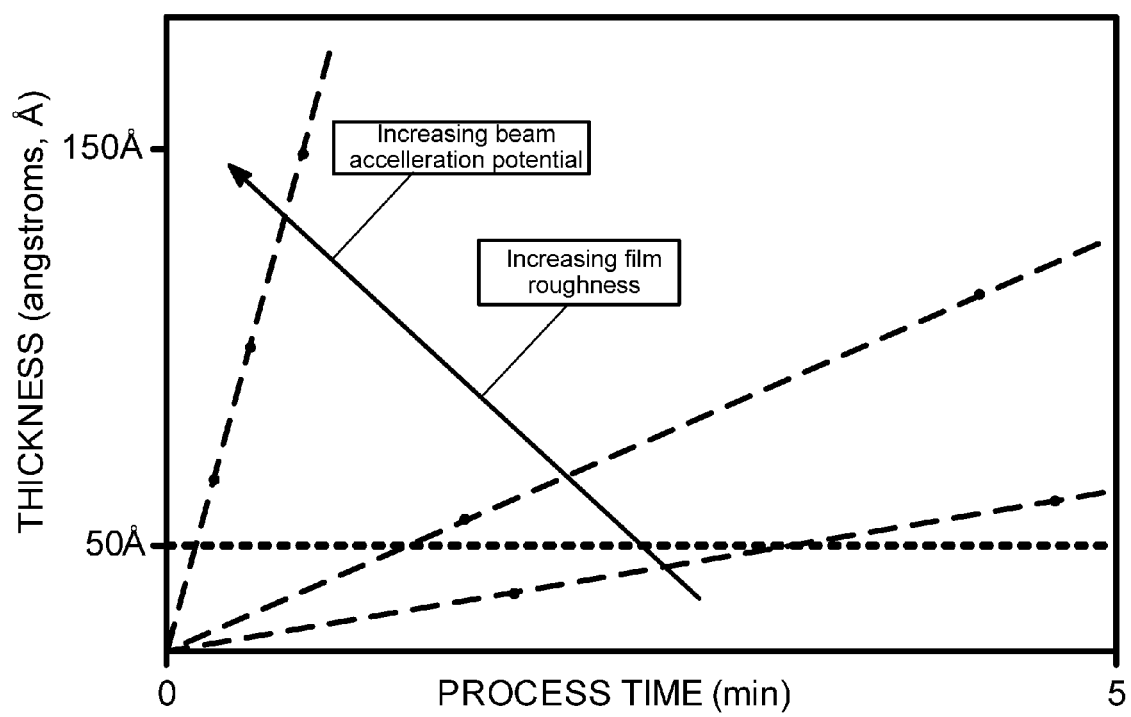

Typically, as shown in FIG. 11, the thickness will increase as a function of process time (or beam dose). The deposition rate (or slope) depends on the beam acceleration potential. Additionally, the surface roughness (average roughness, $R_a$) depends on the beam acceleration potential. As the beam acceleration is increased, the surface roughness will increase. Conversely, as the beam acceleration is decreased, the surface roughness will decrease. As shown in FIG. 11, when the beam acceleration potential is reduced to lower levels, ultra-thin films of moderate surface roughness may be achieved.

Figure 12:
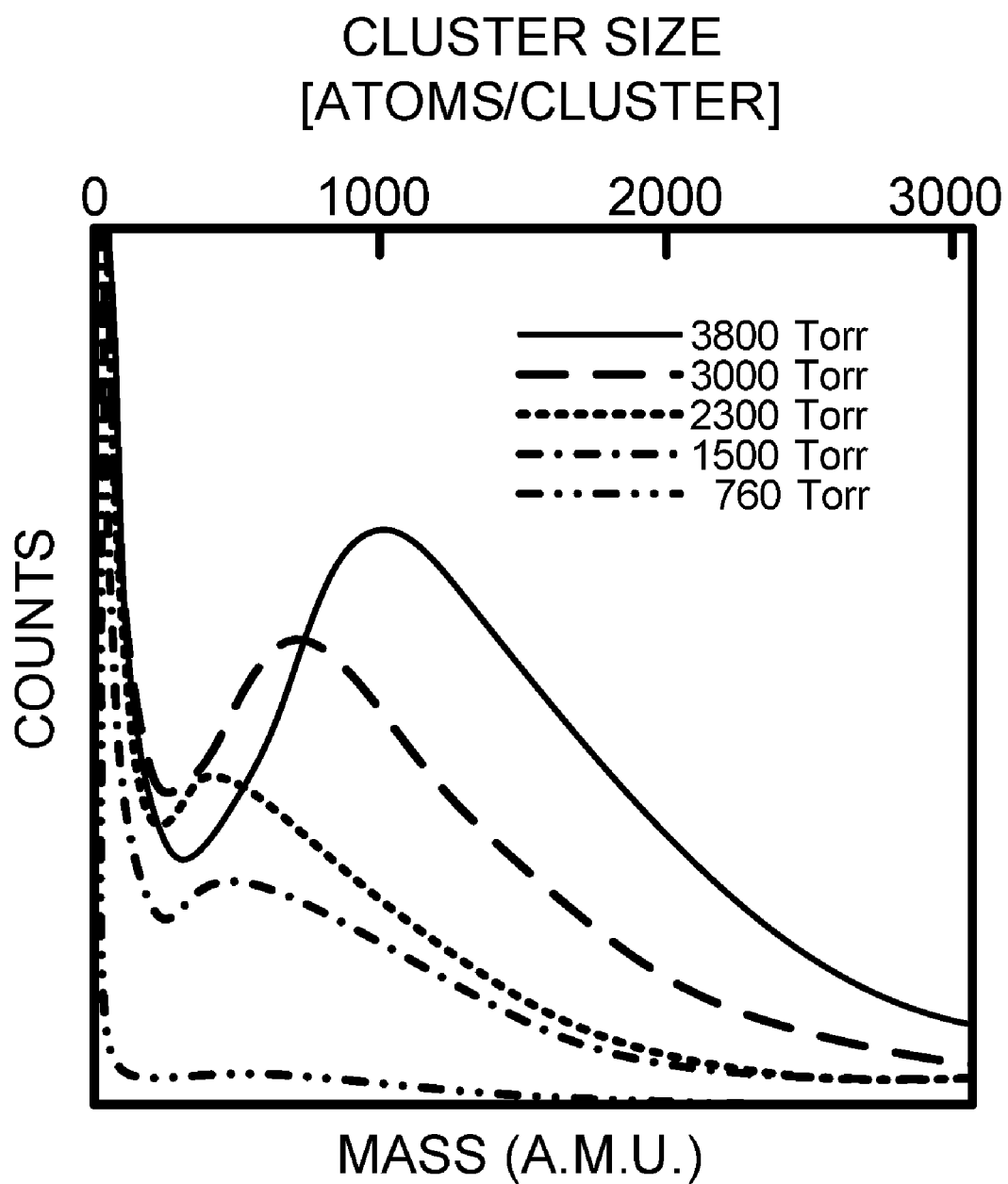
FIG. 12 provides exemplary data for GCIB cluster size.

Referring to FIG. 12, the distribution of cluster size in a GCIB is provided as a function of the total pressure at the inlet of the nozzle in the GCIB processing system (e.g., nozzle 110 in FIGS. 5 through 7). The cluster size distribution was measured for an Ar GCIB using the time of flight method. Therein, cluster counts were recorded as a function of mass, which correlates with the number of atoms per cluster. As shown in FIG. 12, the peak cluster size in each distribution increased with increasing total pressure.

Figure 13:
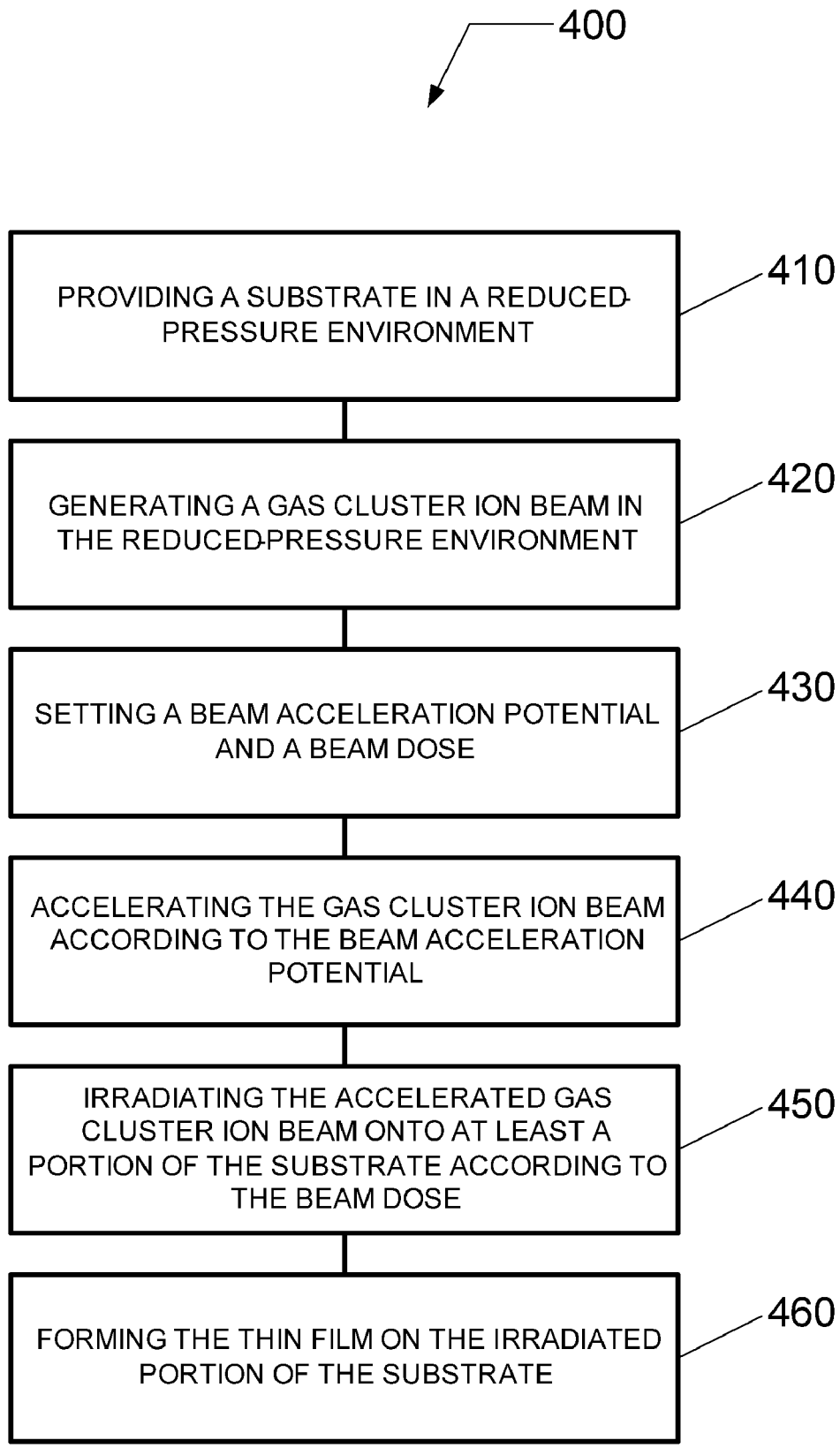
FIG. 13 is a flow chart illustrating a method for forming a thin film using a GCIB according to an embodiment.

Referring to FIG. 13, a method of forming a thin film on a substrate using a GCIB is illustrated according to an embodiment. The method comprises a flow chart 400 beginning in 410 with providing a substrate in a reduced-pressure environment. The substrate can be disposed in a GCIB processing system. The substrate can be positioned on a substrate holder and may be securely held by the substrate holder. The temperature of the substrate may or may not be controlled. For example, the substrate may be heated or cooled during a film forming process. The environment surrounding the substrate is maintained at a reduced pressure.

The GCIB processing system can be any of the GCIB processing systems (100, 100' or 100") described above in FIG. 5, 6 or 7, or any combination thereof. The substrate can include a conductive material, a non-conductive material, or a semi-conductive material, or a combination of two or more materials thereof. Additionally, the substrate may include one or more material structures formed thereon, or the substrate may be a blanket substrate free of material structures.

In 420, a GCIB is generated in the reduced-pressure environment. The GCIB can be generated from a pressurized gas mixture having a film forming composition and an optional inert gas. However, other gases or gas mixtures may be used, as described above.

In 430, a beam acceleration potential and a beam dose are selected. The beam acceleration potential and the beam dose can be selected to achieve a thickness of the thin film ranging up to about 50 Å, and to achieve a surface roughness of an upper surface of the thin film that is less than about 10 Å. Alternatively, the beam acceleration potential and the beam dose can be selected to achieve a thickness of the thin film ranging up to about 50 Å, and to achieve a surface roughness of an upper surface of the thin film that is less than about 8 Å. Alternatively, the beam acceleration potential and the beam dose can be selected to achieve a thickness of the thin film ranging up to about 50 Å, and to achieve a surface roughness of an upper surface of the thin film that is less than about 5 Å.

By way of example, the beam acceleration potential may range up to 100 kV, and the beam dose may range up to about $1 \times 10^{16}$ clusters per $cm^2$. Alternatively, the beam acceleration potential may range up to 50 kV, and the beam dose may range up to about $1 \times 10^{16}$ clusters per $cm^2$. Alternatively, the beam acceleration potential may range up to 25 kV, and the beam dose may range up to about $1 \times 10^{16}$ clusters per $cm^2$. Alternatively, the beam acceleration potential may range up to 10 kV, and the beam dose may range up to about $1 \times 10^{16}$ clusters per $cm^2$. Alternatively, the beam acceleration potential may range up to 5 kV, and the beam dose may range up to about $1 \times 10^{16}$ clusters per $cm^2$. Alternatively, the beam acceleration potential may range up to 5 kV, and the beam dose may range up to about $8 \times 10^{13}$ clusters per $cm^2$. Alternatively, the beam acceleration potential may range up to 4 kV, and the beam dose may range up to about $1 \times 10^{14}$ clusters per $cm^2$. Alternatively, the beam acceleration potential may range up to 3 kV, and the beam dose may range up to about $2 \times 10^{14}$ clusters per $cm^2$. Alternatively yet, the beam acceleration potential may range up to 2 kV, and the beam dose may range up to about $1 \times 10^{15}$ clusters per $cm^2$.

By way of another example, when the beam energy distribution is modified (e.g., using the pressure cell at a pressure-distance integral of about 0.002 torr-cm or about 0.005 torr-cm), the beam acceleration potential may range up to 100 kV, and the beam dose may range up to about $1 \times 10^{16}$ clusters per $cm^2$. Alternatively, when the beam energy distribution is modified (e.g., using the pressure cell at a pressure-distance integral of about 0.002 torr-cm), the beam acceleration potential may range up to 45 kV, and the beam dose may range up to about $1 \times 10^{14}$ clusters per $cm^2$. Alternatively, when the beam energy distribution is modified (e.g., using the pressure cell at a pressure-distance integral of about 0.005 torr-cm), the beam acceleration potential may range up to 45 kV, and the beam dose may range up to about $1.3 \times 10^{14}$ clusters per $cm^2$.

By way of yet another example, the GCIB may be established for an energy per cluster atom (i.e., eV/cluster atom) ranging from about 0.5 eV/cluster atom to about 10 eV/cluster atom. Alternatively, the energy per cluster atom may range from about 1 eV/cluster atom to about 10 eV/cluster atom. Alternatively, the energy per cluster atom may range from about 0.5 eV/cluster atom to about 1 eV/cluster atom. For instance, the ratio, energy per cluster atom, may be varied by varying the total pressure at the inlet of the nozzle in the GCIB processing system to adjust the cluster size (e.g., number of atoms per cluster), or varying the beam acceleration potential to adjust the beam energy, or both.

In 440, the GCIB is accelerated according to the beam acceleration potential. Optionally, as described above, the beam energy may be modified. In one embodiment, the beam energy distribution function for the GCIB is modified by directing the GCIB along a GCIB path through an increased pressure such that at least a portion of the GCIB traverses the increased pressure region. The extent of modification to the beam energy distribution may be characterized by a pressure-distance (d) integral along that portion of the GCIB path. When the value of the pressure-distance integral is increased (either by increasing the pressure and/or the path length (d)), the beam energy distribution is broadened and the peak energy is decreased. When the value of the pressure-distance integral is decreased (either by decreasing the pressure and/or the path length (d)), the beam energy distribution is narrowed and the peak energy is increased. As an example, one may broaden the beam energy distribution to decrease the surface roughness of the thin film, or one may narrow the beam energy distribution to increase the surface roughness of the thin film.

In 450, the accelerated GCIB is irradiated onto at least a portion of the substrate according to the beam dose.

In 460, a thin film is formed on the irradiated portion of the substrate.

As described above, a pre-treatment process and/or post-treatment process may be performed to adjust one or more film properties including, but not limited to, a film thickness, a film roughness, a film adhesion, a film composition, etc. The pre-treatment process and/or the post-treatment process may include exposure to an ion source, a GCIB source, a photon source, an electron source, a plasma source, a microwave radiation source, a thermal source, an electromagnetic (EM) radiation source, etc. For example, a pre-treatment process may include exposing the substrate, or layer upon which the ultra-thin hermetic film is to be formed, to another GCIB, exposing the substrate or layer to a slotted plane antenna (SPA) plasma, or exposing the substrate or layer to electromagnetic (EM) radiation, or any combination of two or more thereof. The exposure to another GCIB may include performing an inert GCIB process or a GCIB growth process to, for instance, improve adhesion and/or assist the ensuing GCIB growth and/or deposition process to form the ultra-thin film. Additionally, for example, a post-treatment process may include exposing the ultra-thin hermetic film to another GCIB, annealing the ultra-thin hermetic film, exposing the ultra-thin hermetic film to a slotted plane antenna (SPA) plasma, or exposing the ultra-thin hermetic film to electromagnetic (EM) radiation, or any combination of two or more thereof. The exposure to another GCIB may include performing an inert GCIB process to, for instance, reduce the film roughness of the ultra-thin film following the GCIB growth and/or deposition process to form the ultra-thin film.

Figure 14:
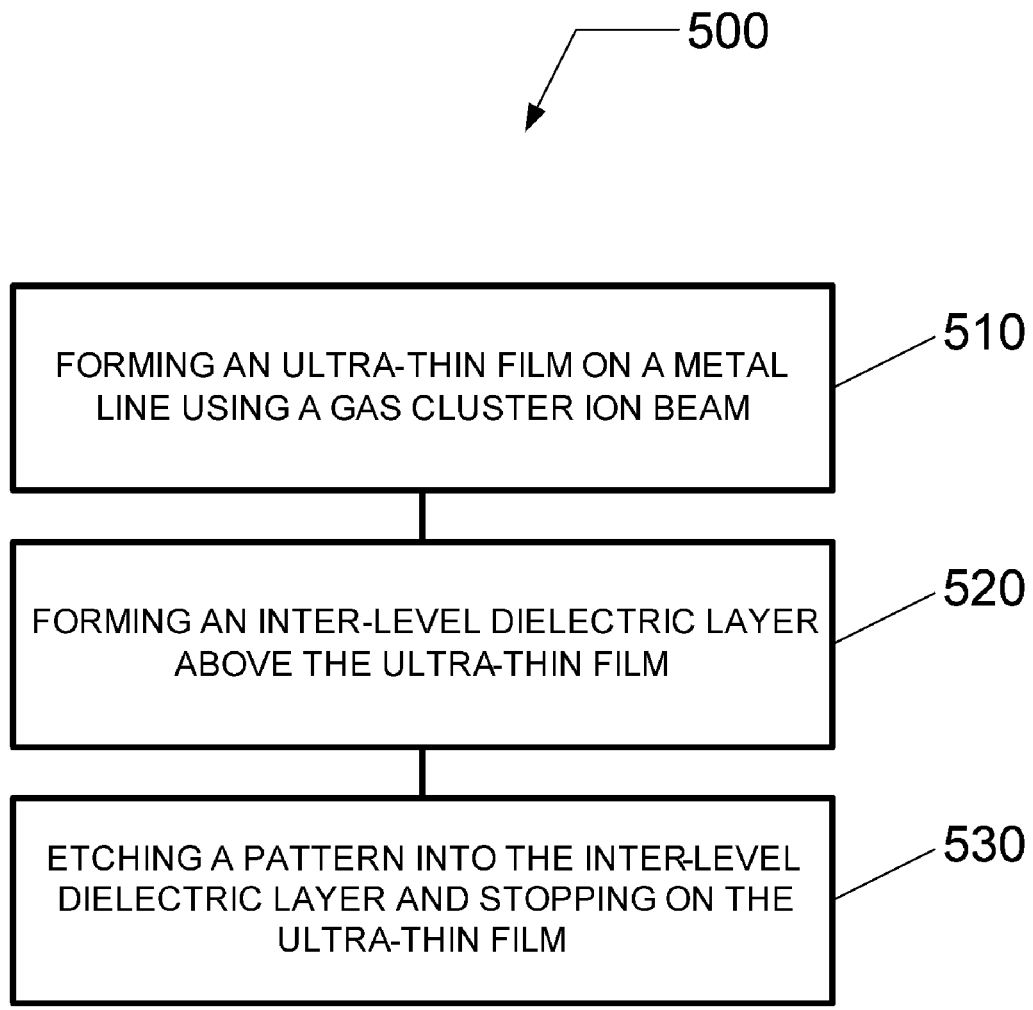
FIG. 14 is a flow chart illustrating a method for forming an interconnect according to an embodiment.

Referring to FIG. 14, a method of preparing an interconnect structure is illustrated according to an embodiment. The method comprises a flow chart 500 beginning in 510 with forming an ultra-thin film over a metal line using a GCIB, wherein the ultra-thin film has a thickness less than approximately 5 nm. Thereafter, in 520, an inter-level dielectric layer is formed above the ultra-thin film, and in 530, a pattern is etched into the inter-level dielectric layer while stopping on the ultra-thin film. The method may further comprise forming one or more thin films between the ultra-thin-film and the inter-level dielectric layer, wherein at least one of the one or more thin films comprises a dielectric layer having a dielectric constant whose value is less than the dielectric constant associated with the ultra-thin film and greater than or equal to the dielectric constant associated with the inter-level dielectric layer. A similar structure illustrating this embodiment of the method is depicted in FIG. 3.

Figure 15:
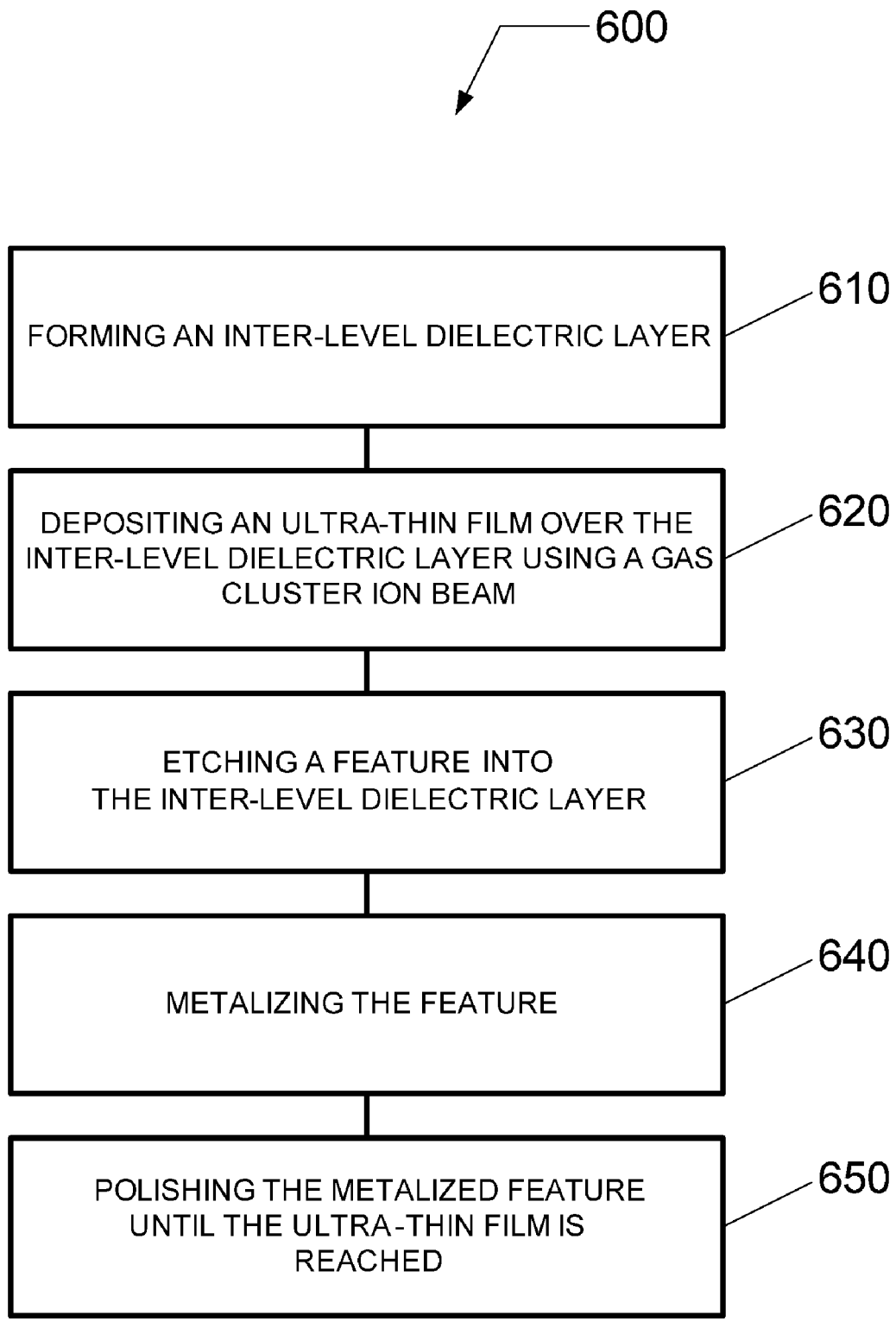
FIG. 15 is a flow chart illustrating a method for forming an interconnect according to another embodiment.
Figure 15A:
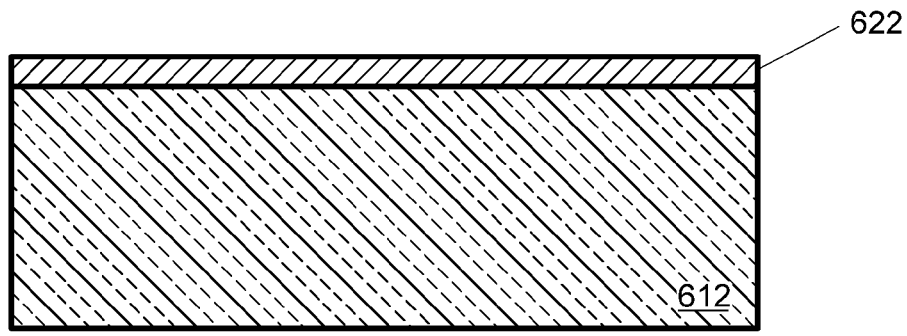
FIGS. 15A-15D are schematic cross-sectional views depicting the method of FIG. 15.
Figure 15B:
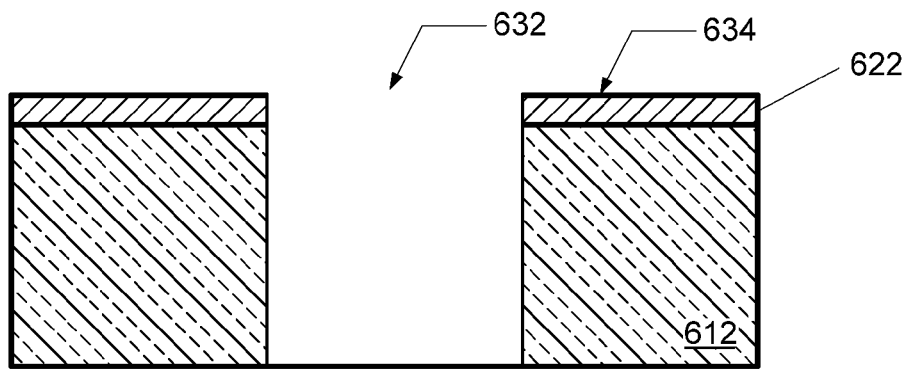
Figure 15C:
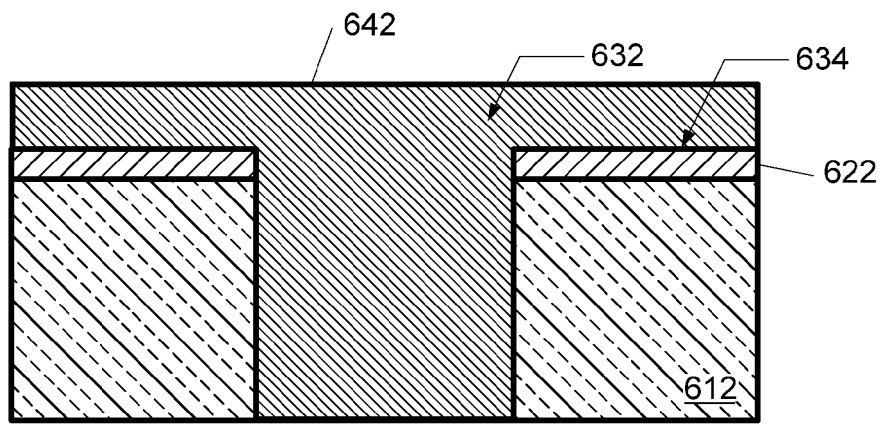
Figure 15D:
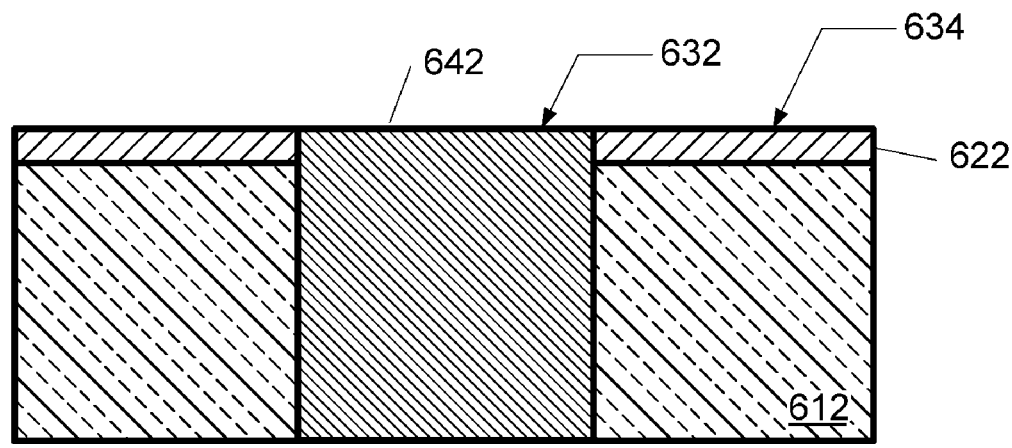

Referring to the flow chart 600 of FIG. 15 and the schematic cross-sectional illustrations of FIGS. 15A-15D, a method of preparing an interconnect structure is illustrated according to another embodiment. Beginning in 610, the method comprises forming an inter-level dielectric layer 612, and in 620, depositing an ultra-thin film 622 over the inter-level dielectric layer 612 using a GCIB, as shown in FIG. 15A. Thereafter, in 630, a feature 632, such as a trench, or via, or both, is etched into the inter-level dielectric layer, as shown in FIG. 15B. In 640, the feature 632 is metalized, meaning that the feature 632 is filled with metal 642, and the metal 642 is further deposited above the feature 632 (i.e., the feature is over-filled) and on the field area 634 surrounding the feature 632, as shown in FIG. 15C. In 650, the metalized trench, or via, or both is polished until the ultra-thin film 622 is reached, i.e., the metal 642 is removed from the field area 634 and from above the feature 632, as shown in FIG. 15D. The method may further comprise forming one or more thin films on the ultra-thin-film, wherein at least one of the one or more thin films comprises a dielectric layer having a dielectric constant whose value is less than the dielectric constant associated with the ultra-thin film 622 and greater than or equal to the dielectric constant associated with the inter-level dielectric layer 612.

Figure 16A:
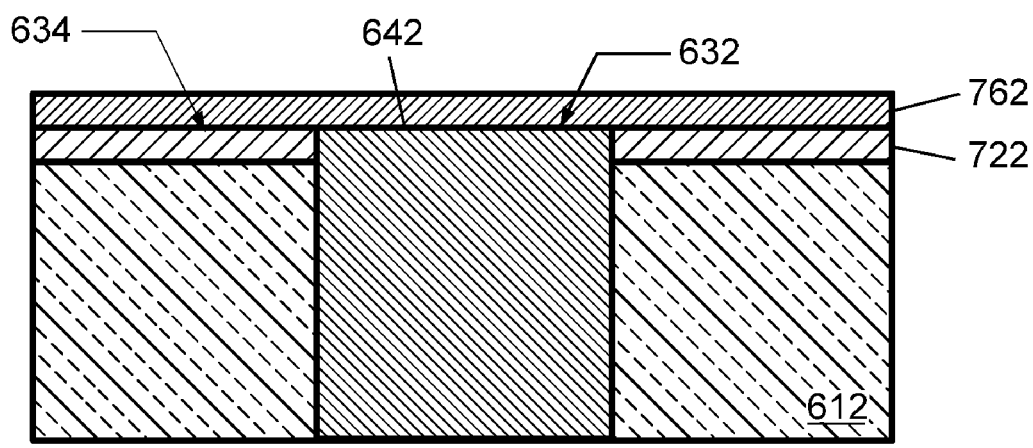
FIG. 16A is a schematic cross-sectional view depicting the method of FIG. 16.
Figure 16:
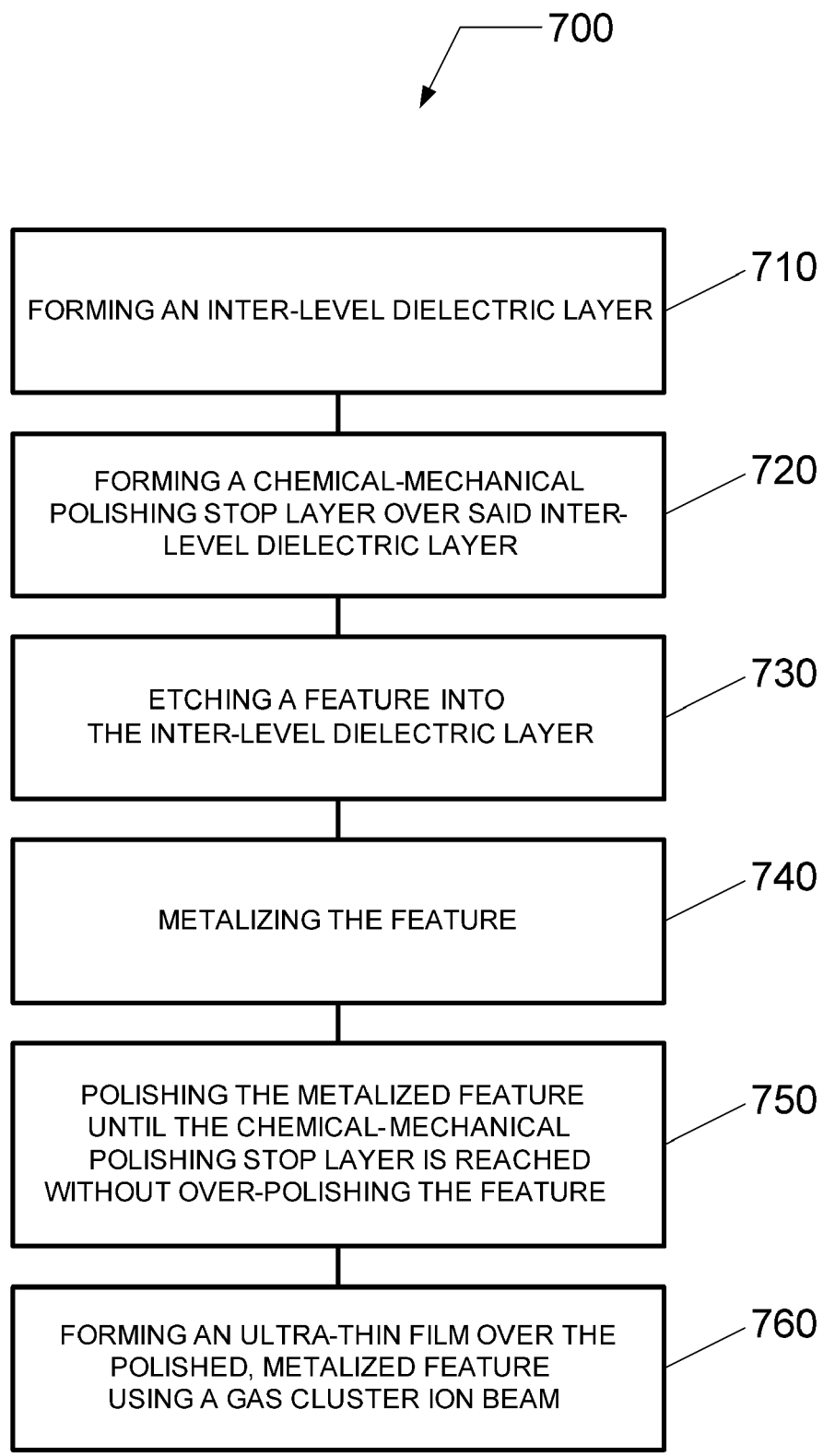
FIG. 16 is a flow chart illustrating a method for forming an interconnect according to another embodiment.

Referring to FIG. 16, a method of preparing an interconnect structure is illustrated according to another embodiment. FIGS. 15A-15D are also generally illustrative of this embodiment, with the final structure being depicted in FIG. 16A. The method comprises a flow chart 700 beginning in 710 with forming an inter-level dielectric layer 612.

In 720, a chemical-mechanical polishing (CMP) stop layer 722 is formed over the inter-level dielectric layer. Thus, instead of the ultra-thin film 622, a CMP stop layer 722 is formed, for example, as described above with respect to layer 72 in FIG. 4.

In 730, a feature 632, such as a trench, or via, or both, is etched into the inter-level dielectric layer and, in 740, the feature 632 is metalized, e.g., filled with metal 642.

In 750, the metalized feature is polished until the CMP stop layer is reached without over-polishing the metalized feature, i.e., without polishing below the level of field area 634.

In 760, an ultra-thin film 762 is formed over the polished, metalized feature using a GCIB, wherein the ultra-thin film 762 has a thickness less than approximately 5 nm.

Figure 17:
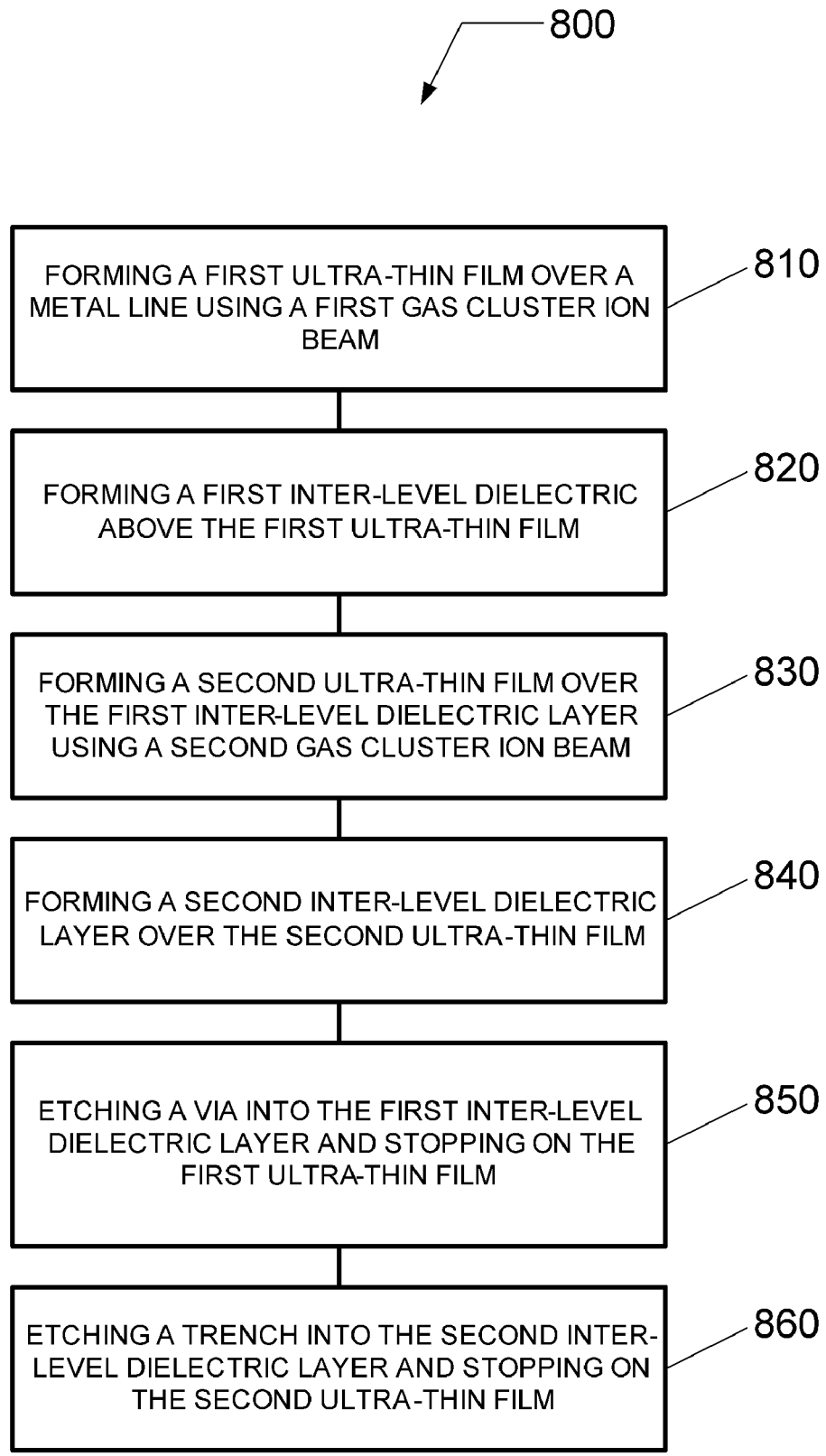
FIG. 17 is a flow chart illustrating a method for forming an interconnect according to another embodiment.
Figure 17A:
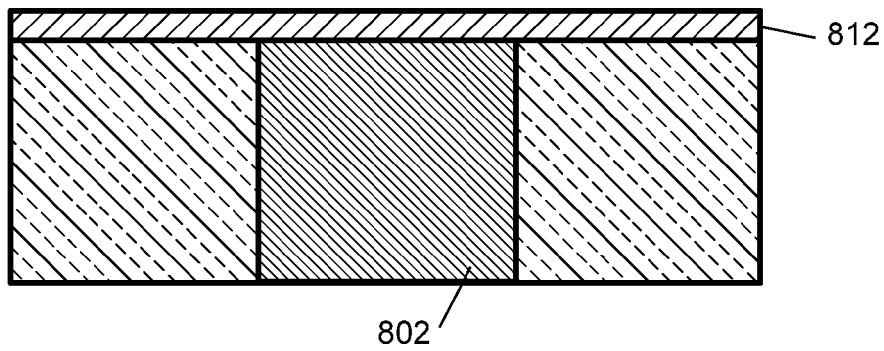
FIGS. 17A-17F are schematic cross-sectional views depicting the method of FIG. 17.

Referring to the flow chart 800 of FIG. 17 and the schematic cross-sectional illustrations of FIGS. 17A-17F, a method of preparing an interconnect structure is illustrated according to another embodiment. Beginning in 810, the method comprises forming a first ultra-thin film 812 over a metal line 802 using a first GCIB, as illustrated in FIG. 17A.

Figure 17B:
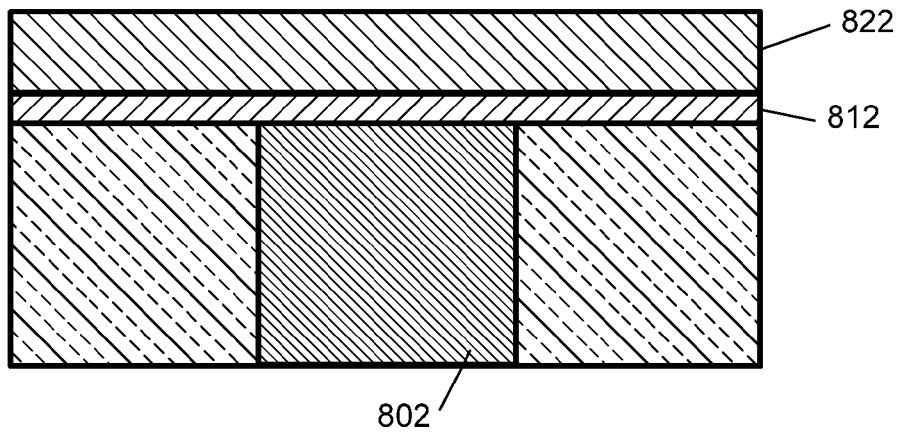

In 820, a first inter-level dielectric layer 822 is formed above the first ultra-thin film 812, as shown in FIG. 17B. The method may further comprise forming one or more thin films between the first ultra-thin-film 812 and the first inter-level dielectric layer 822. The one or more thin films may comprise a dielectric layer having a dielectric constant whose value is less than the dielectric constant associated with the first ultra-thin film 812 and greater than or equal to the dielectric constant associated with the first inter-level dielectric layer 822.

Figure 17C:
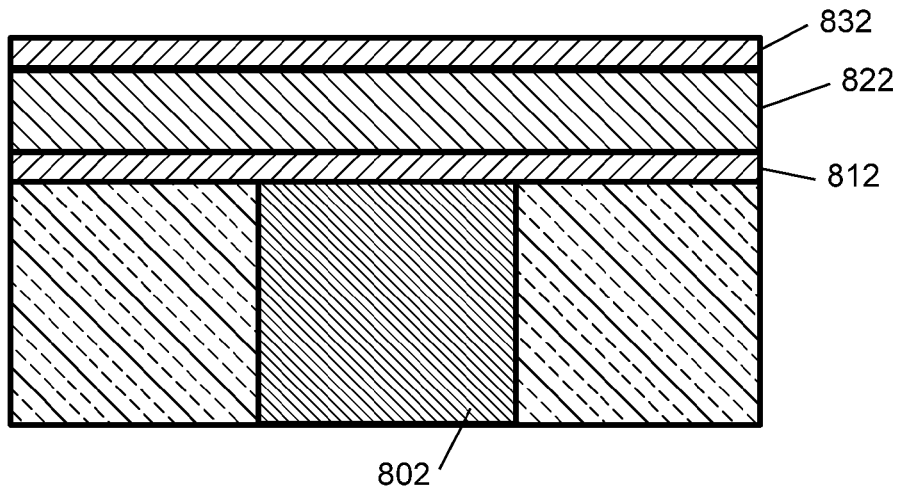

In 830, a second ultra-thin film 832 is formed over the first inter-level dielectric layer 822 using a second GCIB, as shown in FIG. 17C.

Figure 17D:
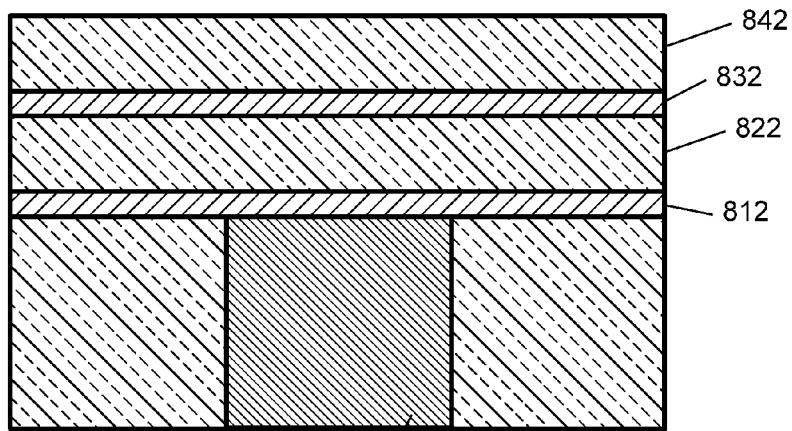

In 840, a second inter-level dielectric layer 842 is formed over the second ultra-thin film 832, as shown in FIG. 17D. The method may further comprise forming one or more thin films between the second ultra-thin-film 832 and the second inter-level dielectric layer 842. The one or more thin films may comprise a dielectric layer having a dielectric constant whose value is less than the dielectric constant associated with the second ultra-thin film 832 and greater than or equal to the dielectric constant associated with the second inter-level dielectric layer 842.

Figure 17E:
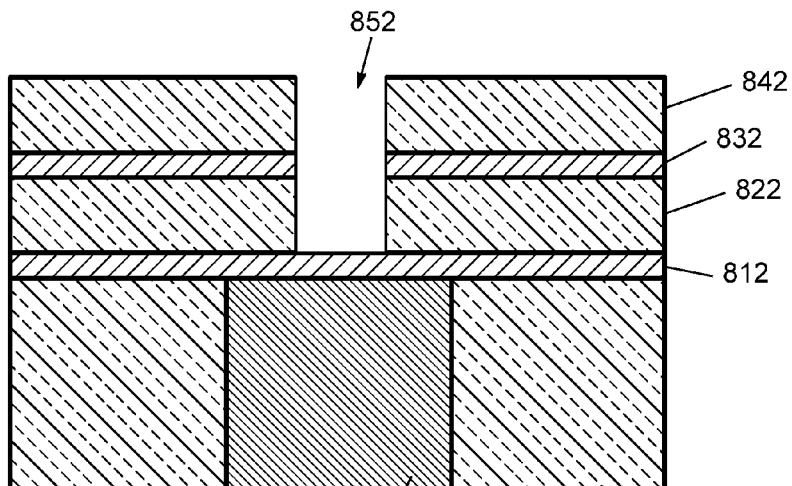
Figure 17F:
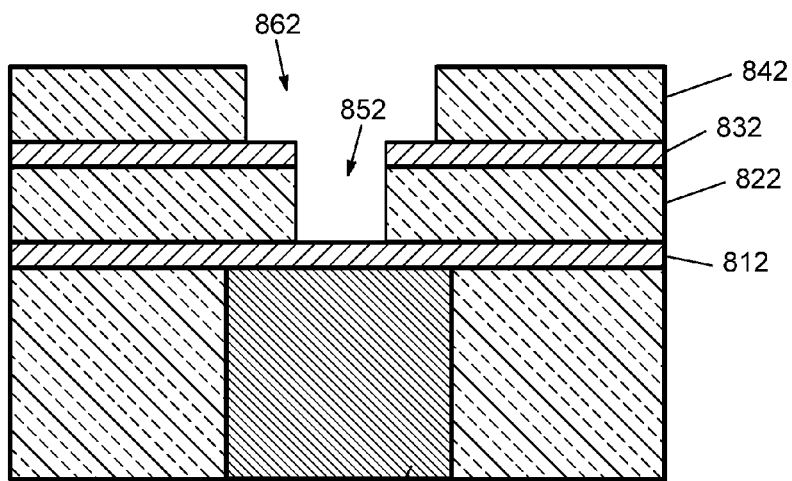

In 850, a via 852 is etched into the first inter-level dielectric layer 822, while stopping on the first ultra-thin film 812, as shown in FIG. 17E, and in 860, a trench 862 is etched into the second inter-level dielectric layer 842, while stopping on the second ultra-thin film 832, as shown in FIG. 17F.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method of preparing a thin film, comprising:
    forming an ultra-thin hermetic film over at least a portion of a substrate using at least one gas cluster ion beam (GCIB),
    wherein said ultra-thin hermetic film has a thickness less than 5 nm, and
    wherein said forming includes (a) optionally growing a mixed sublayer in a surface portion of said substrate by mixing at least one atomic constituent in said substrate with at least one film-forming atomic constituent in said at least one GCIB, and (b) depositing one or more film-forming atomic constituents from said at least one GCIB over said surface portion of said substrate to form a deposited layer, wherein said mixed sublayer and said deposited layer together form the ultra-thin hermetic film.

2. The method of claim 1, comprising:
    providing said substrate in a reduced-pressure environment;
    generating said at least one GCIB in said reduced-pressure environment from a pressurized gas mixture;
    selecting a beam acceleration potential and a beam dose to achieve said thickness of less than 5 nm;
    accelerating said at least one GCIB according to said beam acceleration potential;
    irradiating said accelerated at least one GCIB onto said at least a portion of said substrate according to said beam dose; and forming said ultra-thin hermetic film on said at least a portion of said substrate to achieve said thickness.

3. The method of claim 2, wherein said thickness is less than about 3 nm.

4. The method of claim 2, further comprising:
further selecting said beam acceleration potential and said beam dose to achieve a surface roughness of an upper surface of said ultra-thin hermetic film less than about 10 Å.

5. The method of claim 4, wherein said beam acceleration potential is selected to be less than about 50 kV.

6. The method of claim 4, wherein said beam acceleration potential is selected to be less than about 5 kV.

7. The method of claim 4, further comprising:
modifying a beam energy distribution to change said thickness, or said surface roughness, or both.

8. The method of claim 7, wherein said modifying said beam energy distribution comprises:
broadening said beam energy distribution to decrease said thickness, or decrease said surface roughness, or both; or
narrowing said beam energy distribution to increase said thickness, or increase said surface roughness, or both.

9. The method of claim 7, wherein said modifying said beam energy distribution comprises directing said at least one GCIB along a GCIB path through an increased pressure region such that at least a portion of said GCIB path traverses said increased pressure region.

10. The method of claim 2, further comprising:
pre-treating said substrate; or
post-treating said ultra-thin hermetic film to alter a property of said ultra-thin hermetic film; or
both pre-treating said substrate and post-treating said ultra-thin hermetic film.

11. The method of claim 10, comprising said post-treating or both said pre-treating and said post-treating, and wherein said post-treating comprises exposing said ultra-thin hermetic film to another GCIB, annealing said ultra-thin hermetic film, exposing said ultra-thin hermetic film to a slotted plane antenna (SPA) plasma, exposing said ultra-thin hermetic film to electro-magnetic (EM) radiation, exposing said ultra-thin hermetic film to a photon source, exposing said ultra-thin hermetic film to an ion source, or exposing said ultra-thin hermetic film to an electron source, or any combination of two or more thereof.

12. The method of claim 2, wherein said pressurized gas mixture comprises an oxygen-containing gas, a nitrogen-containing gas, a carbon-containing gas, a hydrogen-containing gas, a silicon-containing gas, a phosphorous-containing gas, a boron-containing gas, an arsenic-containing gas, a sulfur-containing gas, or a germanium-containing gas, or a combination of two or more thereof.

13. The method of claim 2, wherein said at least one GCIB is generated having an energy per cluster atom ranging from about 1 eV/cluster atom to about 10 eV/cluster atom.

14. The method of claim 1, wherein said ultra-thin hermetic film is formed over a metal line, the method further comprising:
forming an inter-level dielectric layer above said ultra-thin hermetic film; and
etching a pattern into said inter-level dielectric layer and stopping on said ultra-thin hermetic film to thereby form an interconnect structure.

15. The method of claim 1, further comprising:
prior to said forming said ultra-thin hermetic film, forming an inter-level dielectric layer;
depositing said ultra-thin hermetic film over said inter-level dielectric layer using said at least one GCIB;
etching a trench, or via, or both into said inter-level dielectric layer;
metalizing said trench, or via, or both; and
polishing said metalized trench, or via, or both until said ultra-thin film is reached to thereby form an interconnect structure.

16. The method of claim 1, further comprising, prior to said forming said ultra-thin hermetic film:
forming an inter-level dielectric layer;
forming a chemical-mechanical polishing (CMP) stop layer over said inter-level dielectric layer;
etching a trench, or via, or both into said inter-level dielectric layer;
metalizing said trench, or via, or both; and
polishing said metalized trench, or via, or both until said CMP stop layer is reached without over-polishing said metalized trench, or via, or both;
wherein said ultra-thin film is formed over said polished, metalized trench, or via, or both using said at least one GCIB to thereby form an interconnect structure.

17. The method of claim 1, wherein said forming said ultra-thin hermetic film includes forming a first ultra-thin hermetic film over a metal line using a first GCIB, the method further comprising:
forming a first inter-level dielectric layer above said first ultra-thin hermetic film;
forming a second ultra-thin hermetic film over said first inter-level dielectric layer using a second GCIB;
forming a second inter-level dielectric layer over said second ultra-thin hermetic film;
etching a via into said first inter-level dielectric layer and stopping on said first ultra-thin hermetic film; and
etching a trench into said second inter-level dielectric layer and stopping on said second ultra-thin hermetic film to thereby form an interconnect structure, wherein each of said first and second ultra-thin hermetic films have said thickness less than 5 nm.

18. The method of claim 17, further comprising:
metalizing said via and said trench; and
polishing said metallized trench and via.

19. The method of claim 1, wherein said forming said ultra-thin hermetic film includes growing said mixed sublayer, followed by said depositing.

20. The method of claim 19, wherein said forming said mixed sublayer includes using a first GCIB, and said depositing includes using a second GCIB.

21. A method of preparing a thin film, comprising:
forming an inter-level dielectric layer over at least a portion of a substrate;
depositing an ultra-thin hermetic film over said inter-level dielectric layer using a gas cluster ion beam (GCIB), wherein said ultra-thin hermetic film has a thickness less than 5 nm;
etching a trench, or via, or both into said inter-level dielectric layer;
metalizing said trench, or via, or both; and
polishing said metalized trench, or via, or both until said ultra-thin hermetic film is reached to thereby form an interconnect structure.

22. The method of claim 21, comprising:
providing said substrate in a reduced-pressure environment;
generating said GCIB in said reduced-pressure environment from a pressurized gas mixture;

selecting a beam acceleration potential and a beam dose to achieve said thickness of less than 5 nm;
accelerating said GCIB according to said beam acceleration potential;
irradiating said accelerated GCIB onto said inter-level dielectric layer according to said beam dose; and
depositing said ultra-thin hermetic film to achieve said thickness.

23. The method of claim 22, further comprising:
further selecting said beam acceleration potential and said beam dose to achieve a surface roughness of an upper surface of said ultra-thin hermetic film less than about 10 Å.

* * * * *